United States Patent [19]
Mehuys et al.

[11] Patent Number: 5,537,432
[45] Date of Patent: Jul. 16, 1996

[54] WAVELENGTH-STABILIZED, HIGH POWER SEMICONDUCTOR LASER

[75] Inventors: David G. Mehuys, Sunnyvale; David F. Welch, Menlo Park; Robert J. Lang, Pleasanton; Donald R. Scifres, San Jose, all of Calif.

[73] Assignee: SDL, Inc., San Jose, Calif.

[21] Appl. No.: 390,121

[22] Filed: Feb. 17, 1995

Related U.S. Application Data

[63] Continuation-in-part of Ser. No. 1,735, Jan. 7, 1993, Pat. No. 5,392,308.

[51] Int. Cl.⁶ .................................................. H01S 3/19
[52] U.S. Cl. .................... 372/50; 372/32; 372/46; 372/94; 372/96; 372/99; 372/102
[58] Field of Search .................... 372/44–50, 97, 372/99, 100, 101, 102, 94, 96, 29, 32

[56] References Cited

U.S. PATENT DOCUMENTS

| | | | |
|---|---|---|---|
| 4,251,780 | 2/1981 | Scifres et al. | 331/94.5 |
| 4,369,513 | 1/1983 | Umeda et al. | 372/46 |
| 4,446,557 | 5/1984 | Figueroa | 372/45 |
| 4,689,797 | 8/1987 | Olshansky | 372/45 |
| 4,726,031 | 2/1988 | Wakao et al. | 372/96 |
| 4,744,089 | 5/1988 | Montroll et al. | 372/50 |
| 4,783,788 | 11/1988 | Gordon | 372/45 |
| 4,791,648 | 12/1988 | Vojak et al. | 372/46 |
| 4,791,649 | 12/1988 | Yamamoto et al. | 372/48 |
| 4,794,346 | 12/1988 | Miller | 330/4.3 |
| 4,796,273 | 1/1989 | Yamaguchi | 372/96 |
| 4,797,894 | 1/1989 | Yaeli | 372/92 |
| 4,802,187 | 1/1989 | Bouley et al. | 372/96 |
| 4,803,696 | 2/1989 | Pepper et al. | 372/95 |
| 4,815,084 | 3/1989 | Scifres et al. | 372/46 |
| 4,860,296 | 8/1989 | Chemla et al. | 372/44 |
| 4,914,665 | 4/1990 | Sorin | 372/20 |
| 4,942,585 | 7/1990 | Ungar | 372/44 |
| 5,003,550 | 3/1991 | Welch et al. | 372/50 |
| 5,140,599 | 8/1992 | Trutna, Jr. et al. | 372/20 |
| 5,175,643 | 12/1992 | Andrews | 359/339 |
| 5,184,247 | 2/1993 | Schimpe | 359/344 |
| 5,200,969 | 4/1993 | Paoli | 372/50 |
| 5,202,285 | 4/1993 | Sugano et al. | 437/129 |
| 5,260,822 | 11/1993 | Missaggia et al. | 359/337 |
| 5,262,644 | 11/1993 | Maguire | 250/339 |
| 5,325,392 | 6/1994 | Tohmori et al. | 372/50 X |
| 5,349,602 | 9/1994 | Mehuys et al. | 372/98 |

OTHER PUBLICATIONS

Sorin et al., "Single-frequency output from a broadband-tunable external fiber-cavity laser," *Optics Letters*, vol. 13, No. 9, Sep. 1988.

Zorabedian et al., "Interference-filter-tuned, alignment-stabilized, semiconductor external-cavity laser," *Optics Letters*, vol. 13, No. 10, pp. 826–828, Oct. 1988.

(List continued on next page.)

*Primary Examiner*—Rodney B. Bovernick
*Assistant Examiner*—Hemang Sanghavi
*Attorney, Agent, or Firm*—Schneck & McHugh

[57] ABSTRACT

A wavelength-stabilized, semiconductor laser having a light amplifying diode heterostructure with a flared gain region in an external resonant cavity. The flared gain region has a narrow aperture end which may be coupled to a single mode waveguide and a wide output end. A light emitting surface of the heterostructure proximate to the wide end of the flared gain region is partially reflective and combines with an external reflector to form a resonant cavity that is effectively unstable. The intracavity light-emitting surface proximate to the narrow aperture end is antireflection coated. The external reflector may be a planar mirror or a grating reflector. A lens or an optical fiber may couple the aperture end of the flared gain region to the external reflector. Frequency-selective feedback is provided by orienting the grating reflector or providing a prism in the cavity in front of the external planar mirror. Other filtering elements may also be placed in the external cavity. The flared gain region and waveguide may be differentially pumped or modulated with current provided by separate contacts.

105 Claims, 11 Drawing Sheets

OTHER PUBLICATIONS

Goldberg et al., "Single lobe operation of a 40–element laser array in an external ring laser cavity", *Applied Physics Letters,* vol. 51, pp. 871–873, 21 Sep. 1987.

Surette et al., "High–Power Ring Laser Using a Broad–Area GaAlAs Amplifier", *IEEE Photonics Technology Letters,* vol. 5, pp. 919–922, Aug. 1993.

Bernacki et al., "Alignment–insensitive technique for wideband tuning of an unmodified semiconductor laser," *Optics Letters* vol. 13, No. 9, pp. 725–727, Sep. 1988.

Fujita et al., "Polarization bistability in external cavity semiconductor lasers," *Appl. Phys. Lett.,* 51(6), pp. 392–394, Aug. 10, 1987.

Helms et al., "Stable Operation Range for Laser Diodes with an Integrated Passive Cavity in the Presence of External Optical Feedback," *IEEE Photonics Technology Letters,* vol. 1, No. 12, pp. 409–411, Dec. 1989.

Hori, et al., "External–Cavity Semiconductor Laser with Focusing Grating Mirror," *IEEE Journal of Quantum Electronics,* vol. 26, No. 10, pp. 1747–1755, Oct. 1990.

Mittelstein et al., "Broadband Tunability of gain–flattened quantum well semiconductor lasers with an external grating," *Appl. Phys. Lett.,* 54(12), 1092–1094, Mar. 20, 1989.

Notomi et al., "Broad–Band Tunable Two–Section Laser Diode with External Grating Feedback," *IEEE Photonics Technology Letters,* vol. 2, No. 2, pp. 85–87, Feb. 1990.

Schremer et al., "Single–frequency tunable external–cavity semiconductor laser using an electro–optic birefringent modulator," *Appl. Phys. Lett.,* 55(1), pp. 19–21, Jul. 3, 1989.

Schremer et al., "External–Cavity Semiconductor Laser with 1000 GHz Continuous Piezoelectric Tuning Range," *IEEE Photonics Technology Letters,* vol. 2, No. 1, pp. 3–5, Jan. 1990.

Sharfin et al., "Lateral–Mode Selectivity in External–Cavity Diode Lasers with Residual Facet Reflectivity," *IEEE Journal of Quantum Electronics,* vol. 26, No. 10, pp. 1756–1763, Oct. 1990.

Ludeke et al., "Single Mode GaAs Laser in External Cavity," *IBM Technical Disclosure Bulletin,* vol. 15, No. 2, pp. 548–549, Jul. 1972.

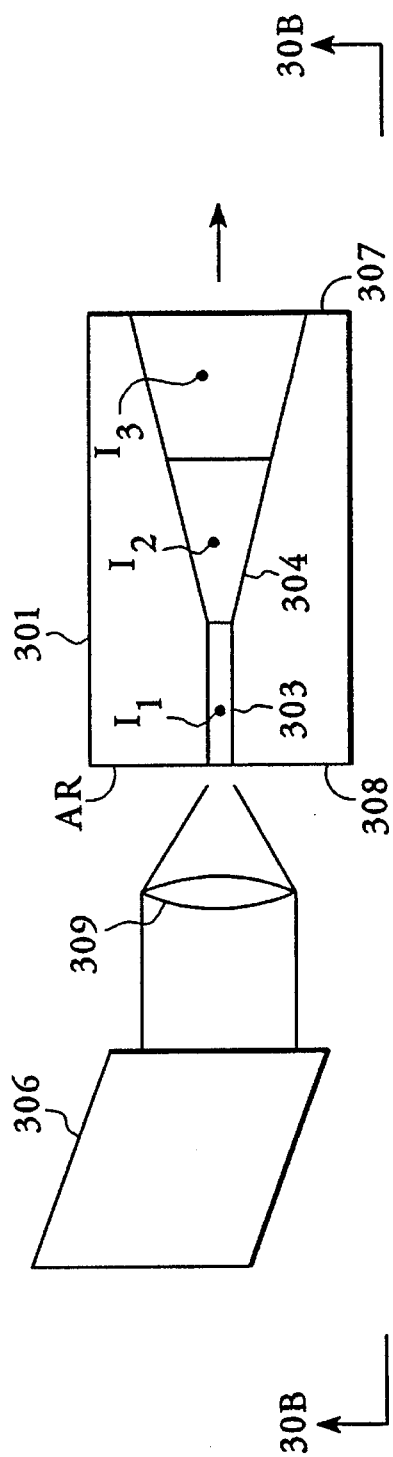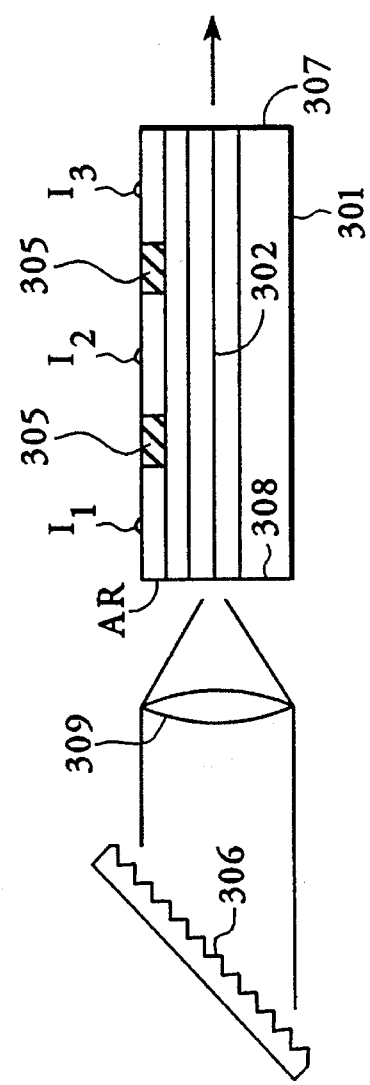
FIG. 30A
FIG. 30B

WAVELENGTH-STABILIZED, HIGH POWER SEMICONDUCTOR LASER

CROSS-REFERENCE TO RELATED APPLICATION

This is a continuation-in-part of application Ser. No. 08/001,735, filed Jan. 7, 1993, now U.S. Pat. No. 5,392,308.

TECHNICAL FIELD

The present invention relates to external-cavity semiconductor lasers, especially to those lasers that include a wavelength-selective element for wavelength stabilized and narrow linewidth light emission. The invention also relates to lasers with single spatial mode, diffraction-limited emission, and to light amplifying diode heterostructures with flared gain regions.

BACKGROUND ART

External-cavity semiconductor lasers, including lasers with frequency (wavelength) selective elements in the cavity, are well known for tuning of the lasers' output wavelength and have been extensively studied. For example, W. Sorin, et al., in *Optics Letters* 13(9), pages 731–733(1988), describe a laser having a laser diode with one of its facets AR coated to reduce its reflectivity, a lens, a single mode optical fiber and a tunable evanescent grating reflector for providing feedback. The laser is wavelength tunable by sliding the feedback grating laterally over the fiber. P. Zorabedian et al., in *Optics Letters* 13(10), pages 826–828(1988), describe another wavelength tunable laser using either a rotatable interference filter in an external Fabry-Perot cavity or an external grating reflector providing tunable frequency-selective feedback.

A problem with previously available externalcavity semiconductor lasers is their generally low output power (on the order of 10 mW cw and 200–00 mW pulsed). Further, higher output powers are associated with unstable output intensity and frequency and less than good modal quality. For many applications, such as Raman spectroscopy, industrial process control, atomic or molecular absorption spectroscopy, environmental monitoring, projection displays, nonlinear frequency conversion, and various scientific uses, it is desirable to have a compact, high power laser diode with a stable wavelength output. Monolithically integrated DBR lasers, while capable of achieving wavelength stabilization, are not easily fabricated in all laser diode materials, leaving gaps in the wavelength bands accessible to stabilization. For example, DBR lasers are not practicable at about 750–800 nm, which is an especially suitable wavelength band for Raman spectroscopy.

In U.S. Pat. No. 5,262,644, Maguire describes the use of an infrared laser source for Raman spectroscopy. For maximum utility, the laser wavelength lies between a lower limit determined by fluorescence of the material sample to be analyzed and an upper limit determined by loss in the optical fiber used to deliver light from the laser to the sample. A more fundamental upper limit may be imposed by the detector used to gather the Raman-scattered radiation. For example, the responsivity of silicon-based detectors peaks in the wavelength region 750–950 nm, and the responsivity of germanium-based detectors peaks in the wavelengtgh region 1000–1700 nm. In addition, the scattering cross-section of the Raman process varies as $1/\lambda^4$, making shorter wavelength excitation sources preferred, provided fluorescence does not dominate and obscure the Raman signal. Hence, the approximate wavelength band 700–1000 nm is preferred for performing Raman spectroscopy. Maguire teaches the use of a Nd:YAG laser operating at 1064 nm or a krypton ion laser, which can operate at 799 nm or 752 nm, as suitable infrared radiation sources. We have recognized that semiconductor lasers easily access the 700–1000 nm wavelength band, and that, provided the wavelength of the laser output could be sufficiently stabilized, such semiconductor lasers would also make suitable sources for Raman spectroscopy.

In U.S. Pat. No. 4,251,780, Scifres et al. describe semiconductor injection lasers that are provided with a stripe offset geometry in order to enhance and stabilize operation in the lowest order or fundamental transverse mode. In one configuration, the stripe geometry has a horn shaped or trapezoidal section connected to a straight section, in which the width of the horn shaped or trapezoidal section expands from 8 µm at the straight section to 25 µm at the cleaved end facet. In contrast to configurations in which the edges of the stripe waveguides are linear and orthogonal to the cleaved end facets of the lasers, the nonorthogonal angled or curved edges of the offset stripe geometries cause higher order modes to reflect or radiate out of the waveguide, thereby increasing the threshold of the higher order modes relative to the fundamental mode.

In U.S. Pat. No. 4,815,084, Scifres et al. describe semiconductor lasers and laser arrays in which lenses and other optical elements have been integrated into the semiconductor bodies of the lasers by means of refractive index changes at boundaries in the light guiding region, where the boundaries are characterized by a lateral geometric contour corresponding to surfaces of selected optical elements so as to cause changes in shape of phase fronts of lightwaves propagating across the boundaries in a manner analogous to the change produced by the optical elements. In one embodiment, a biconcave or plano-concave diverging lens element is integrated within the laser in order to counteract the self-focusing that usually occurs in broad area lasers and that can lead to optical filamentation and lateral incoherence across the laser. The diverging lens in the laser allows the laser to operate as an unstable resonator, leading to high output power and good coherence across the lateral wavefront.

Ring lasers using semiconductor gain elements have been described previously. In particular, a ring laser using broad area laser diodes or diode laser arrays in a double-pass configuration is described by Goldberg et al. in *Applied Physics Letters*, vol. 51, pages 871–873 (1987). Also, a single-pass ring laser using rectangular broad-area amplifiers is described by Surette et al. in *IEEE Photonics Technology Letters*, vol. 5, pages 919–922 (1993).

An object of the invention is to provide a high power, external cavity, semiconductor laser with a stable, single frequency (wavelength), narrow linewidth light output.

Another object of the invention is to provide a high power, wavelength stabilized, external cavity, semiconductor laser which emits a single spatial mode, diffraction-limited output beam.

DISCLOSURE OF THE INVENTION

The above objects are met with a laser in which a semiconductor active medium is located within an at most marginally stable resonant cavity with a single-spatial-mode filter therein. The semiconductor active medium is preferably an electrically pumped light amplifying diode heterostructure or "amplifier chip" that has a flared gain region with a narrow, single mode, optical aperture end and a broad light output end. The flared gain region permits the light to freely diffract as it propagates in the gain region, so the light has a diverging phase front. The diverging light is incident on the front reflector of the laser cavity and reflected such that the backward propagating light continues to diverge. Only the central-most light rays of backward propagating light can pass through the narrow aperture end of the flared gain region to reach an external rear reflector of the resonant cavity. Rear reflectors integral with the diode heterostructure could also be used. The rear reflector can be a mirror surface in combination with a frequency selective element located within the cavity, or can be a frequency selective grating reflector fixed at a certain angle relative to the amplifier chip. The orientation of the grating reflector determines which wavelength of light will couple back through the narrow aperture in the amplifier chip into the flared gain region. Depending on the resolution of the grating reflector and coupling optics, and the size of the aperture forming the single-spatial-mode filter, stabilized output bandwidths of from less than 1 MHz up to 50 GHz are readily achieved. The flared gain region ensures high power amplification of forward propagating light while maintaining a single spatial mode of oscillation.

The invention also includes related master oscillator power amplifier (MOPA) devices in which a first portion of the above described semiconductor active medium is located within the resonant cavity to form a laser oscillator with external rear reflector, while a second portion of the same active medium is located outside the resonant cavity to form an optical power amplifier that is optically coupled to the laser oscillator.

BRIEF DESCRIPTION OF THE DRAWINGS

FIGS. 30A and 30B are respective top and side plan views of a wavelength-stabilized, external cavity, differentially pumped, semiconductor laser of the present invention.

BEST MODE FOR CARRYING OUT OF THE INVENTION

Figure 1:
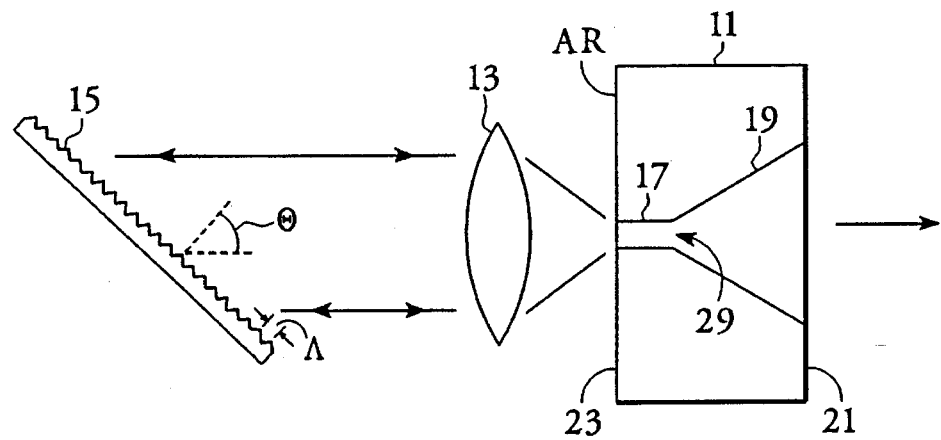
FIG. 1 is a schematic top plan view of a wavelength-stabilized, external cavity, semiconductor laser of the present invention.

With reference to FIG. 1, an external-cavity semiconductor laser, in accord with one embodiment of the present invention, has an active gain medium that is a light amplifying diode heterostructure or "amplifier chip" 11, and also has a light reflective, external, diffraction grating 15 and a lens 13. The amplifier chip 11 shown in FIG. 1 has a single mode waveguide section 17 incorporated on the grating side of the chip, opening into a flared gain section 19 on the output side of the chip. Preferably, the flared gain region 19 is linearly flared and increases in width toward the front output facet 21 of the amplifier chip 11 at a rate that is slightly greater than the divergence of light propagating within the flared gain region 19. The front output facet 21 is typically coated for low reflection. The coated facet 21 typically has a reflectivity of not more than about 5%, but at least about 0.5%. The rear facet 23 on the grating side of the amplifier chip 11 is antireflection coated in order to suppress self-oscillation of the chip. A reflectivity of 0.1% or less is preferred.

The lens 13 is a high numerical aperture lens positioned to receive and collimate light emitted from the single-mode waveguide 17 through the antireflection-coated rear facet 23. A spherical lens with a focal length of from 2 to 8 mm is typical. A graded-index (GRIN) rod lens could also be used. Although a simple single element lens is shown, a more complex lens system to correct for astigmatic and chromatic aberration or other optical phenomena could be used.

The front output facet 21 of the amplifier chip 11 and the external grating 15 form a frequency-selective optical resonator in which diffraction from the reflective grating 15 provides frequency-selective feedback of light into the single mode waveguide section 17 of the amplifier chip 11. For first order diffraction, the wavelength $\lambda$ is given by the equation $\lambda = 2\Lambda \sin \Theta$, where $\Lambda$ is the grating pitch or tooth spacing and $\Theta$ is the angle of light incidence and diffraction with respect to the grating normal, as shown in FIG. 1. A typical diffraction grating for use in the present invention has a line density in a range of about 1200–2400 mm$^{-1}$ and has a first-order-diffraction differential efficiency $\eta_{-1}$ which is greater than 70%.

In operation, the single mode waveguide section 17 incorporated in the grating side of the amplifier chip 11 acts as a spatial mode filter to enhance single-spatial-mode oscillation in the laser cavity. Also, in combination with the external, fixed orientation, grating reflector 15, the narrow aperture of the waveguide section 17 acts to select an extremely narrow frequency band, effectively a single stabilized wavelength, for feedback and laser oscillation, since for a given fixed grating orientation, only light of a particular frequency or wavelength will be diffracted back to the precise position on the amplifier chip's rear facet 23 needed to couple into the narrow waveguide section 17 of the amplifier chip 11. Upon exiting the waveguide section 17 into the flared gain section 19, the forward traveling waves of the light beam are allowed to freely diffract as they propagate in the junction plane of the amplifier chip 11, since the flare of the gain section 19 exceeds the divergence of the beam. The light has a diverging phase front in the gain section 19, owing at least in part to the narrow waveguide 17 (Waveguide 17 may be as narrow as 0.5 μm to several micrometers wide to cause significant beam diffraction.), and continues to diverge after reflection from the low reflectivity output facet 21, as seen in the amplifier chip 11 shown in FIG. 3. Only the central ray 31 returns through the narrow waveguide section 17. Since the low intensity portion of the light beam diverges in traveling back to the narrow end 29 of the gain section, the narrow end 29 and waveguide 17 act as a spatial filter or aperture to enforce single mode oscillation. Higher order spatial modes experience significantly greater diffraction losses within the optical cavity (in addition to having poorer overlap with the flared gain element 19) and are therefore suppressed to high threshold current levels. The external cavity with flared gain section effectively acts as a resonator with a highly selective spatial filter, which minimizes the net loss of the lowest order mode relative to higher order modes. It is desirable that optical power be output through the low reflectivity facet 21. Alternatively, power output could be obtained by a different order of diffraction off of the grating 15 or by placing a partial beamsplitter in the external cavity.

Figure 2A:
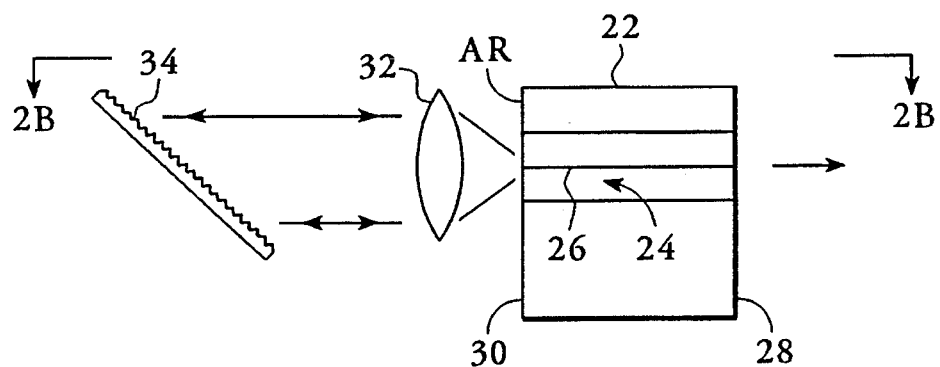
FIGS. 2A and 2B are respective side and top plan views of another wavelength-stabilized, external cavity, semiconductor laser of the present invention.
Figure 2B:
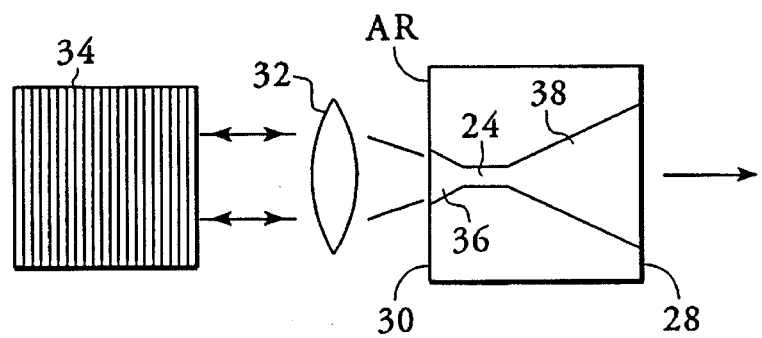

In FIG. 1, the external rear grating reflector 15 has an orientation in which the lines or grooves of the grating are perpendicular to the plane of the pn junction in the diode heterostructure 11. However, such an orientation is not essential. FIGS. 2A and 2B show an alternate embodiment in which an external rear grating reflector 34 has an orientation in which the lines or grooves of the grating reflector 34 are parallel to the plane of the pn junction 26 of the diode heterostructure or "amplifier chip" 22. A resonant optical cavity is defined by the grating reflector 34 and a lower reflectivity front facet 28 of the amplifier chip 22. The fixed orientation of the grating reflector 34 determines the narrow wavelength band of light that will resonate in the cavity, since only light of the selected wavelength will be reflected back upon the incident light path and be imaged by the lens 32 onto the AR coated intracavity rear facet 30 of the amplifier chip 22 at a position that will allow it to be recoupled back into the transverse waveguide 24 within the amplifier chip 22. Other wavelengths of light will be diffracted at different angles and so will be imaged by lens 32 either above or below the position of the waveguide 24. The grating orientation shown in FIGS. 2A and 2B is the more conventional orientation. All figures showing an external grating as a portion of the cavity can be used with either of the grating orientations in FIG. 1 and FIGS. 2A and 2B.

In FIGS. 2A and 2B, the single mode waveguide 24 serving as the spatial mode filter in amplifier chip 22 need not extend all of the way to the antireflection (AR) coated intracavity rear facet 30. Rather, a short flared region 36 could be provided in the amplifier chip 22 between the single mode waveguide 24 and the rear facet 30. In operation, light that has the particular wavelength to be reflected by the grating reflector 34 back onto its incident light path will be focussed by lens or lens system 37 through the rear facet 30 into the short flared region 36. The short flared region 36 tapers down to the single mode waveguide 24 at a rate that allows the light to be efficiently coupled into the waveguide 24. Forward propagating light emerging from the single mode waveguide 24 is then allowed to freely diffract and diverge in the principal flared gain 38 of the amplifier chip 22, in which the optical power is increased to high levels at the output facet 28.

In FIGS. 3–12, several possible amplifier chip embodiments for use in the external-cavity configuration of the present invention are depicted. All of the amplifier chips in FIGS. 3–12 are light amplifying diode heterostructures with their front and rear facets suitably coated to prevent self-oscillation. Only when at least one external reflector, such as the grating 15 in FIG. 1, is provided to help establish a resonant optical cavity will laser oscillation occur. Alternatively, if the rear facets of any of these light amplifying chips is HR coated, such devices can form unstable resonator lasers which are stable to high coherent power levels and do not rely on an external reflector. In addition, an internal grating can be used for wavelength stabilization. Various heterostructure material compositions, such as GaAs/AlGaAs, InGaAs/AlGaAs, InP/InGaAsP and the like, could be used. Likewise, various known strained, graded index and lattice matched structures, as well as various known current, carrier and optical confinement structures, including single and multiple quantum well structures, may be used. A light amplifying diode heterostructure exhibiting a broadband gain-flattened spectrum at high pump current densities can be constructed with single quantum well structures, as described by M. Mittelstein, et al. in *Applied Physics Letters*, 54(12), pp. 1092–1094(1989). The amplifier chip's active region can be optimized for use in external cavities like that shown in FIG. 1 by reducing the optical confinement $\Gamma$ in the transverse direction perpendicular to the pn junction of the chip in order to reduce the transverse or vertical divergence of light emitted from front and rear facets. In this way, the coupling efficiency of external optical elements is increased. A further advantage of a lower optical confinement $\Gamma$ is that lensing associated with charge variations and gain saturation is reduced.

Figure 3:
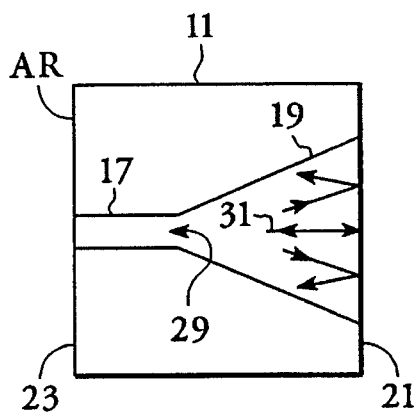
FIGS. 3–10 and 12 are top plan views of various possible light amplifying diode heterostructure devices or "amplifier chips" for use in the laser embodiments of FIGS. 1 and 2A–2B.
Figure 4:
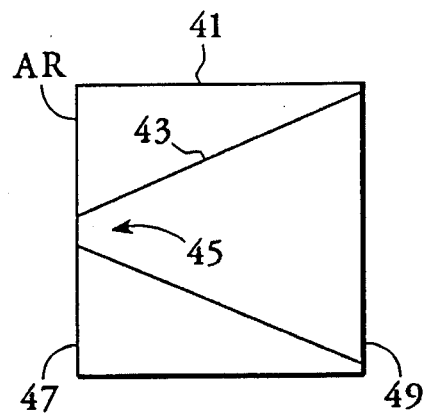
Figure 5:
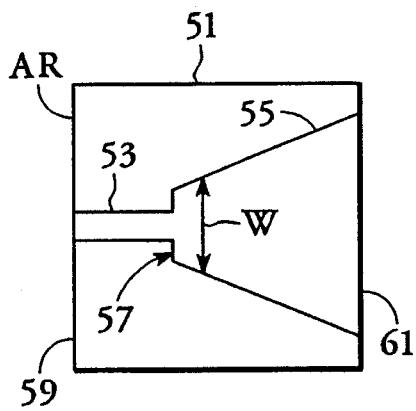

The amplifier chip 11 seen in FIG. 3 is the same as that shown in FIG. 1 and has a single mode waveguide section 17, at a rear end of the chip 11, followed by a flared gain section 19 at a front, output, end of the chip 11. The amplifier chip 11 has an antireflection coated or nearly-AR coated rear facet 23 and a low reflectivity front facet 21. The width of the narrow end of the gain section 19 is the same as the width of the waveguide 17. In FIG. 4, another amplifier chip 41 has only a flared gain region 43 and no single mode waveguide section. The flared gain region 43 has a narrow aperture end 45 at the antireflection coated rear facet 47 and a broader output end at low reflectivity front output facet 49. In FIG. 5, an amplifier chip 51 has a single mode waveguide section 53 and a flared gain section 55. However, the narrow end 57 of the gain section 55 has a width W which is not equal to the width of the waveguide 53, but is instead wider than the waveguide section 53. As in the amplifier chip 11 in FIG. 3, the gain region 55 of amplifier 51 is preferably linearly flared and increases at a constant rate that is slightly greater than the divergence of light propagating in the gain region 55. However, gain sections with nonlinear flares, i.e. having increases in width that are not at a constant rate across the length of the gain section 55 or broad area gain sections, could also be used. The amplifier chip 51 has an antireflection coated rear facet 59 and a low reflectivity front output facet 61. The flared gain regions 19, 43 and 55 in FIGS. 3–5 increase the optical output power while maintaining a single spatial mode. Typically, 5 mW cw power at the narrow input end 29, 45 and 57 of the gain regions are increased over a length of 1000 μm or more to greater than 1 W cw output power at the output facets 21, 49 and 61. The flared amplifier configuration maximizes efficiency by expanding the gain volume along the length of the amplifier as the optical power grows, so that near uniform power density and saturated carrier density are maintained throughout the gain region.

Figure 6:
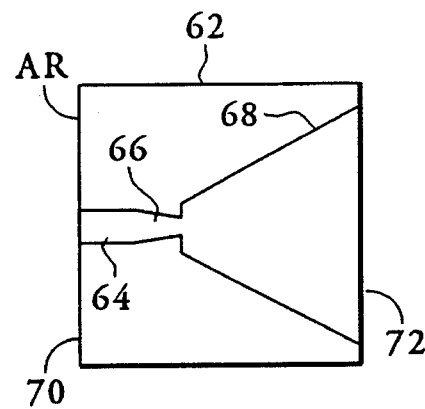

With reference to FIG. 6, the amplifier chip 62 has a single mode waveguide 64 that first tapers in a section 66 to a smaller aperture before leading into the flared amplifier section 68 to increase the beam divergence in the flared region 68. As in previous embodiments, end facets 70 and 72 are coated for low reflectivity.

Figure 7:
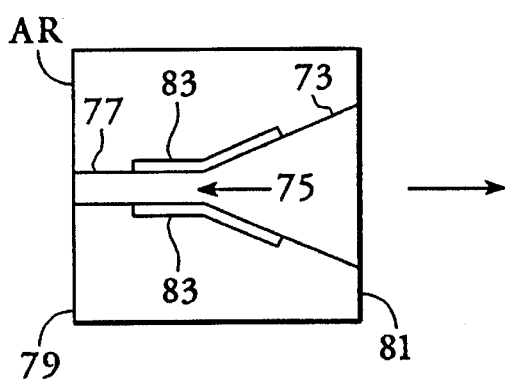

With reference to FIG. 7, yet another light amplifying semiconductor diode heterostructure 71 includes a multimode gain region 73, preferably flared, permitting the propagation of light therein with a diverging phase front. The flared gain region 73 has a single spatial mode light aperture 75 at a narrow end of the flared gain region 73. The aperture 75 preferably comprises a single mode waveguide section 77 in the diode heterostructure 71 optically coupled at one end to the flared gain region 73. The opposite end of the waveguide 77 terminates in the AR coated rear end facet 79. The front end facet 81 at the broad end of the flared gain region 73 furthest from the single mode aperture 75 typically has a low reflectivity of not more than about 5%, but at least about 0.5%. The diverging light that is reflected by front end facet 81 continues to diverge. Only the centralmost rays couple through the narrow aperture 75 into the waveguide 77. Lossy regions 83 may be provided at the side edges of the waveguide 77 and gain region 73 near the aperture 75 in order to suppress oscillation of any light that could be coupled out of the gain region 73 into other portions of the diode heterostructure 71 other than through the light aperture 75. The lossy regions 83 may be low bandgap absorption regions formed by impurity induced disordering or implantation or by epitaxial growth of different levels or heights, such as by growth upon a terraced or channeled substrate. Alternatively, the top heterostructure layers could be etched away in these regions 83 down through the active layer or layers.

Figure 8:
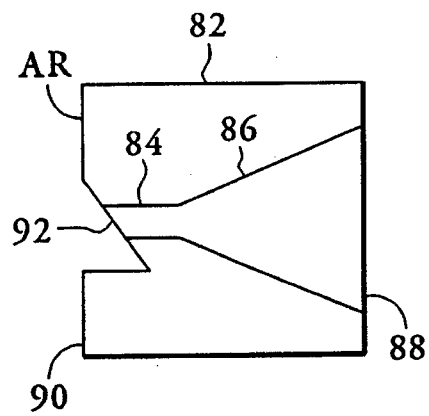

With reference to FIG. 8, an amplifier chip 82 has a single mode waveguide section 84 followed by a flared gain section 86. The front facet 88 of the amplifier chip 82 has low reflectivity, for establishing a resonant cavity with a rear grating reflector, as in FIGS. 1, or 2A and 2B. In this embodiment, the back facet 90 of the amplifier chip 82 is formed with a Brewster angle surface 92 at least at the aperture of the single mode waveguide section 84. The Brewster angle surface 92 can be formed by ion beam milling and may be oriented, as shown, with the normal or perpendicular to the surface 92 parallel to the pn junction of the amplifier chip 82. Alternatively, the normal to surface 92 could be perpendicular to the pn junction. The orientation in which the Brewster angle surface 92 is formed determines whether the TE or TM polarization mode of oscillation is supported by the cavity. The Brewster surface 92 also directs any light reflected by the surface 92 out of the single mode waveguide 84, thereby effectively minimizing back facet reflectivity and preventing self-oscillation of the amplifier chip 82. The facet 90 and Brewster surface 92 might additionally be antireflection coated. Further, even if the surface 92 is angled at other than Brewster's angle, suppression of self-oscillation will be enhanced by the combination of an antireflection coating and the angled surface 92.

Figure 9:
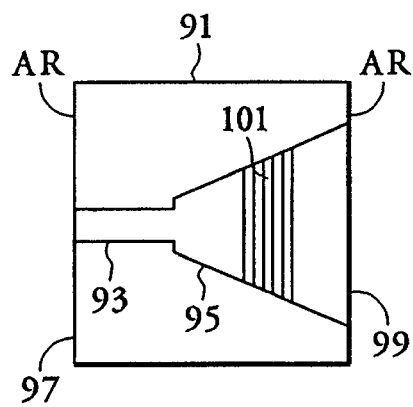

In FIG. 9, the amplifier chip 91 includes a single mode waveguide section 93 followed by a flared section 95, and AR coated or low reflectivity facets 97 and 99. However, here a DBR grating 101 is located in the flared section 95. This internal reflector 101 could also be an etched mirror.

Figure 10:
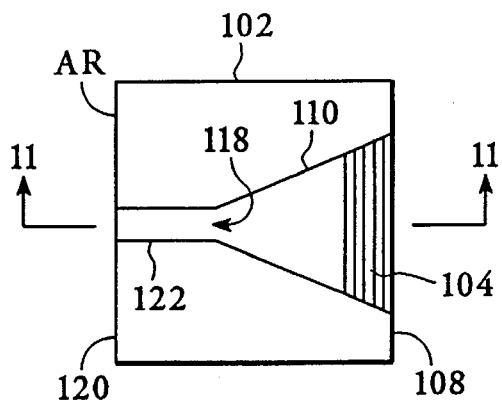
Figure 11:
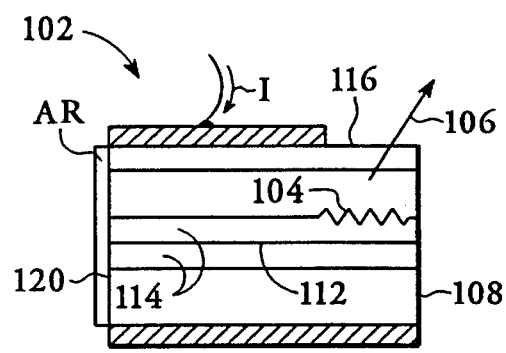
FIG. 11 is a side sectional view taken along the line 11—11 in FIG. 10.

With reference to FIGS. 10 and 11, the amplifier chip 102 may have a detuned grating output coupler 104 integrated therein for providing surface emission 106 of the laser output, rather than end emission from a front facet 108. The detuned grating is located adjacent to the front facet 108 at an end of the flared gain section 110 of the amplifier chip 102 so that the amplified light propagating in the waveguide defined by the active region 112 and cladding layers 114 is coupled by the grating 104 vertically out of the waveguide and through a top (or bottom) surface 116 of the amplifier chip 102. The narrow aperture end 118 of the flared gain section 110 at the rear end thereof is optically coupled to an antireflection (AR) coated near facet 120, preferably, but not necessarily, via a single mode waveguide section 122. The overall effective reflectivity of the grating 104, front facet 108 and output surface 116, taken together, is generally low, i.e. less than about 30%, and typically less than about 10%. Alternatively, front facet 108 may be AR coated and grating 104 may be a tuned grating to provide feedback.

Figure 12:
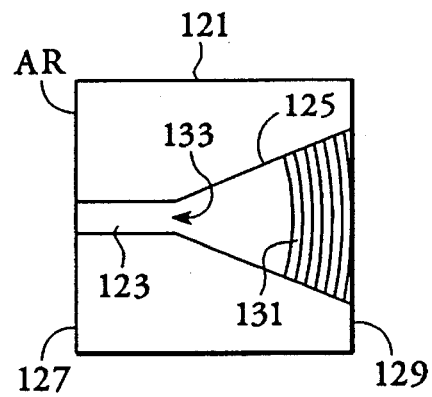

With reference to FIG. 12, an amplifier chip 121 with a single mode waveguide section 123 and a flared gain section 125 located between a pair of parallel planar end facets 127 and 129, of which facet 127 is antireflection coated, has a curved grating output coupled 131 at the broad end of the flared gain section 125, instead of the straight grating 104 of FIGS. 10 and 11. Light emerging from the waveguide 123 at the narrow aperture 133 freely diffracts in the flared gain section 125 as a divergent beam. The divergent beam is characterized by curved phase fronts. The grating output coupler 131 is a detuned surface emitting grating, like the grating 104 in FIGS. 10 and 11, but has a curvature that matches the curved phase fronts of the lightwaves propagating in the flared gain section 125. The light emerges through a top or bottom surface of the amplifier chip 121 as a substantially collimated beam. Single spatial mode filtering by the aperture 133 of the reflected light returning to the waveguide 123 works best if the back reflectivity of the curved grating 131 is minimized and made substantially less than the low reflectivity of the planar front facet 129.

Figure 13:
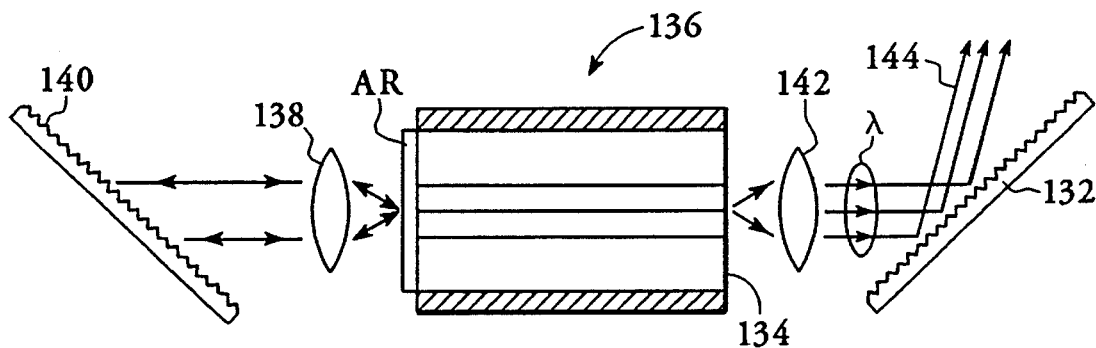
FIGS. 13 and 14 are side views of two alternate wavelength-stabilized, external cavity, semiconductor lasers of the present invention.

With reference to FIG. 13, an angled external front grating reflector 132, receiving light emitted through a front end facet 134 of an amplifier chip 136 with a flared gain region, may be used instead of the integral detuned grating 104 or 129 in FIGS. 10–12 to redirect the light into a vertical or transverse direction. The amplifier chip 136 is positioned within a frequency selective external cavity having a lens 138 and an external rear grating reflector 140, as shown in FIG. 13. A collimating lens or lens system 142 may be placed between the front facet 134 of the amplifier chip 136 and the external front grating reflector 132, so that the emitted light received by the front grating 132 has the same angle of incidence upon the grating 132, regardless of the position of incidence of individual light rays. Alternatively, the grating reflector 132 could be curved to receive the diverging light directly from the emitting facet 134 and reflect it in a collimated beam 144. An angled planar or concave mirror could also be used in place of the front grating reflector 132 to redirect (or both redirect and collimate) the light output.

Figure 14:
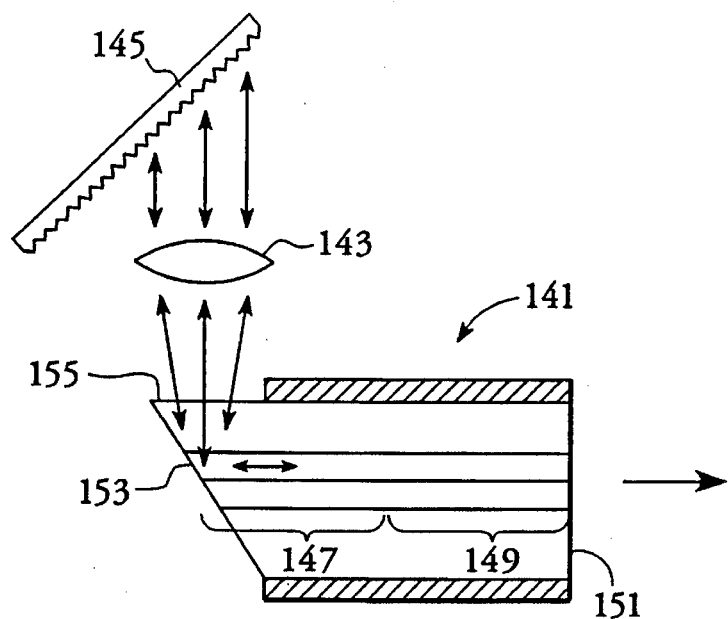

With reference to FIG. 14, another amplifier chip 141, located in an external cavity with a lens 143 and external grating reflector 145, has a single mode waveguide section 147 and a flared gain section 149 as in any of FIGS. 3–12. A front end output facet 151 is of low reflectivity and defines a resonant cavity along with the external grating reflector 145. The fixed orientation of the grating 145 functions to select a stable frequency of laser oscillation. The amplifier chip 141 also has a back facet 153 that is tilted at an angle, typically about 45°, sufficient to cause it to be totally internally reflecting of backward propagating light in the waveguide and also of light fed back by grating reflector 145 and focused by lens 143 onto the facet 153 in the neighborhood of the single mode waveguide section 147. Light is thus coupled vertically through a substantially nonreflective top (or bottom) amplifier chip surface 155. Surface 155 can be AR coated also. Use of the totally internally reflecting angled back facet 153 minimizes self-oscillation, because backward propagating light from the waveguide section 147 is reflected vertically out of the waveguide and allowed to freely diffract in the amplifier chip 141 before reaching the output surface 155. Any light reflected by the substantially nonreflective output surface 155 has little chance of being coupled back into the waveguide section 147.

Figure 15:
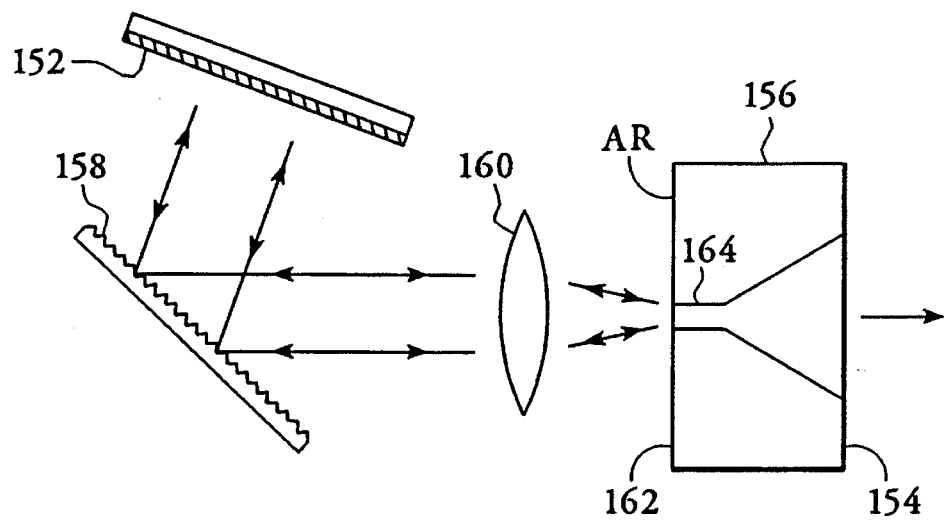
FIG. 15 is a top plan view of yet another wavelength-stabilized, external cavity, semiconductor laser of the present invention.

With reference to FIG. 15, another external cavity laser configuration (Littman-Metcalf) that can be used with any of the light amplifying chips shown in FIGS. 3–12 includes an external mirror 152, which, in combination with the front end facet reflector 154 on the amplifying chip 156, establishes an optical resonant cavity for producing laser oscillation. A grating reflector 158, in the light path between the amplifying chip 156 and the mirror 152, acts as a wavelength selective filter in the cavity. For any given fixed grating orientation, only that wavelength for which the light is diffracted by the grating 158 for normal incidence and reflection by the mirror 152 will oscillate, because only then will light emitted at the back facet 162 from the narrow aperture 164 of the amplifying chip 156 be coupled on its return back into the chip 156 through the aperture 164. As in the embodiment in FIG. 1, a lens 160 may be used to collimate the back emitted light and to refocus the return light into the aperture 164. Alternatively, in place of a planar grating 158 and lens 160, a curved grating may be used.

Figure 16A:
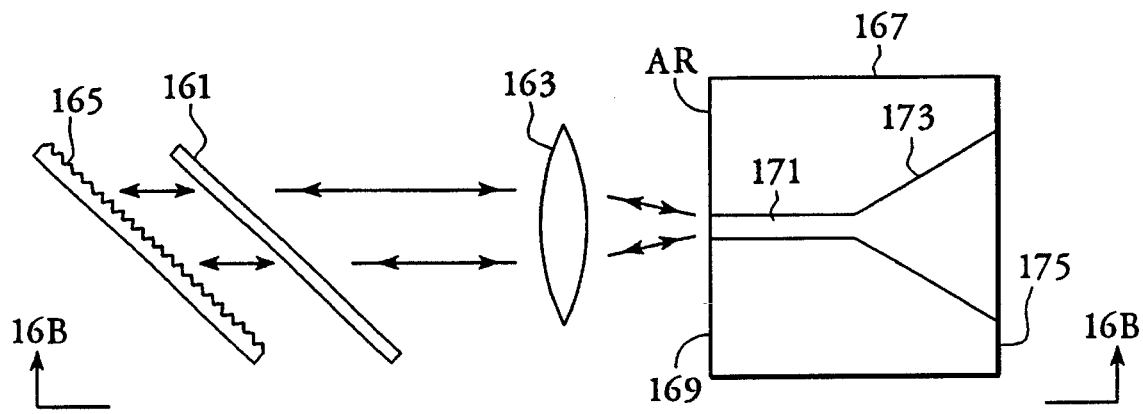
FIGS. 16A and 16B are respective top and side plan views of another wavelength-stabilized, external cavity, semiconductor laser of the present invention.
Figure 16B:
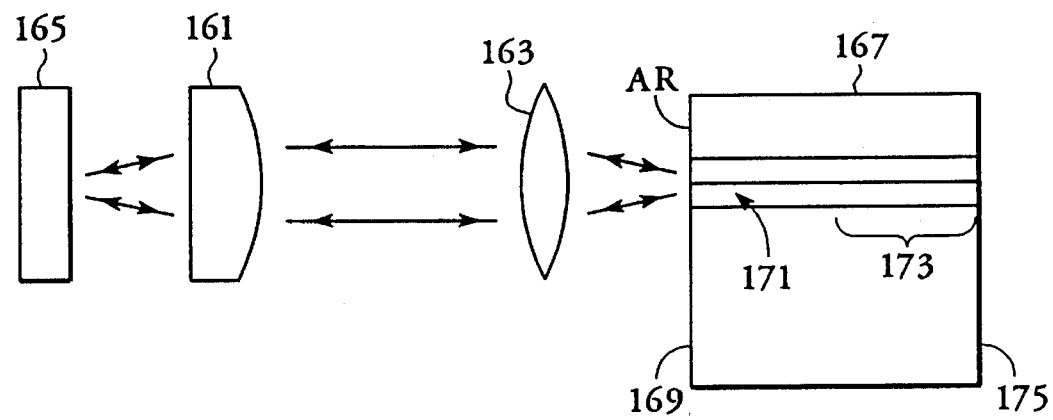

With reference to FIGS. 16A and 16B, a cylinder lens 161 may be provided in the external cavity to focus the collimated light received from the spherical lens 163 down to a line onto the external grating reflector 165. The cylinder lens 161 is oriented with its axis of curvature perpendicular to the length of the grooves on the grating and parallel to the face of the grating. The resulting focused line of light extends across multiple grooves over the full extent of the grating for efficient diffraction and dispersion of the wavelengths emitted from the amplifying chip 167. The cylinder lens 161 and spherical lens 163 reimage the diffracted light on the rear facet 169. Due to the wavelength dispersion provided by the grating reflector 165, only a single narrow wavelength band will couple back through the narrow aperture provided by the single-mode waveguide 171 in the chip 167 so as to oscillate. The chip 167 may be any of those shown in FIGS. 3–12 with a gain region 173 allowing propagation of a diverging wavefront toward the front output facet 175.

Figure 17:
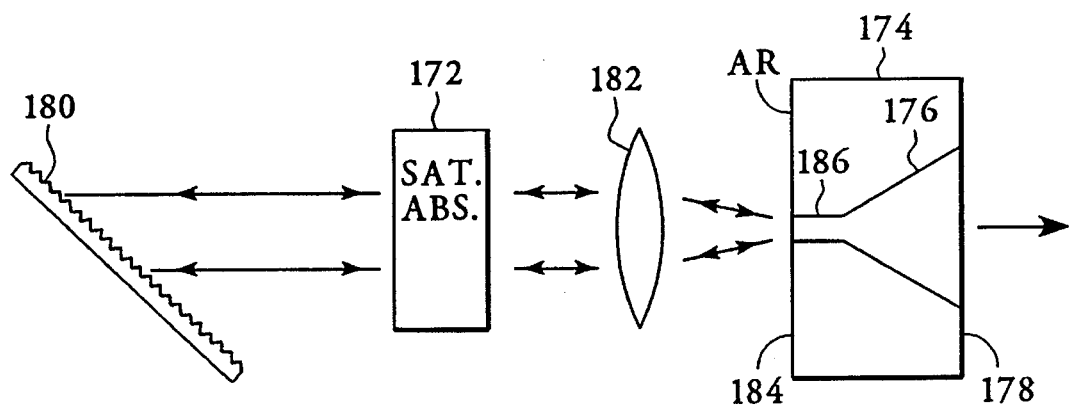
FIG. 17 is a top plan view of an external cavity semiconductor laser with mode locking.

A saturable absorber 172 can be incorporated into the external cavity to act as a Q-switch for generating short pulses, as seen in FIG. 17. An amplifier chip 174 having a flared gain region 176 is placed within a resonant cavity defined by a low reflectivity front end facet 178 of the amplifier chip 174 and an external rear reflector 180. Rear reflector 180 may be a fixed grating reflector. A lens 182 and the saturable absorber 172 are positioned between an AR coated rear facet 184 of the amplifier chip 174 and the rear reflector 180. Lens 182 receives light emitted from the narrow aperture end of the flared gain region 186 through AR coated rear facet 184 and collimates the light beam for passage through saturable absorber 172 to the rear reflector 180. Lens 182 also receives the return light reflected from the rear reflector 180 back through saturable absorber 172 and focuses the light onto the rear facet 184 for coupling through the narrow aperture into the flared gain region 176 of the amplifier chip 174. The cavity configuration provides for mode locked, high average and peak power operation of laser in a pulsed mode. A saturable absorber formed by an unpumped or reverse biased region in the chip along the length of the cavity can also provide mode locked operation. Synchronous pumping of at least a portion of flared gain region 176 or single mode gain region 186 at a period coinciding with the round trip transit time of light pulses in the cavity also results in picosecond pulse lengths and very high peak power outputs. The effectively unstable resonant cavity provided in part by the flared gain region 176 together with narrow, single mode, aperture 186 and fixed grating reflector 180 ensures stable, single mode operation even at high power.

With reference to FIGS. 18–23, other wavelength stabilized cavity configurations using one of the above described amplifier chips with flared gain region are possible.

Figure 18:
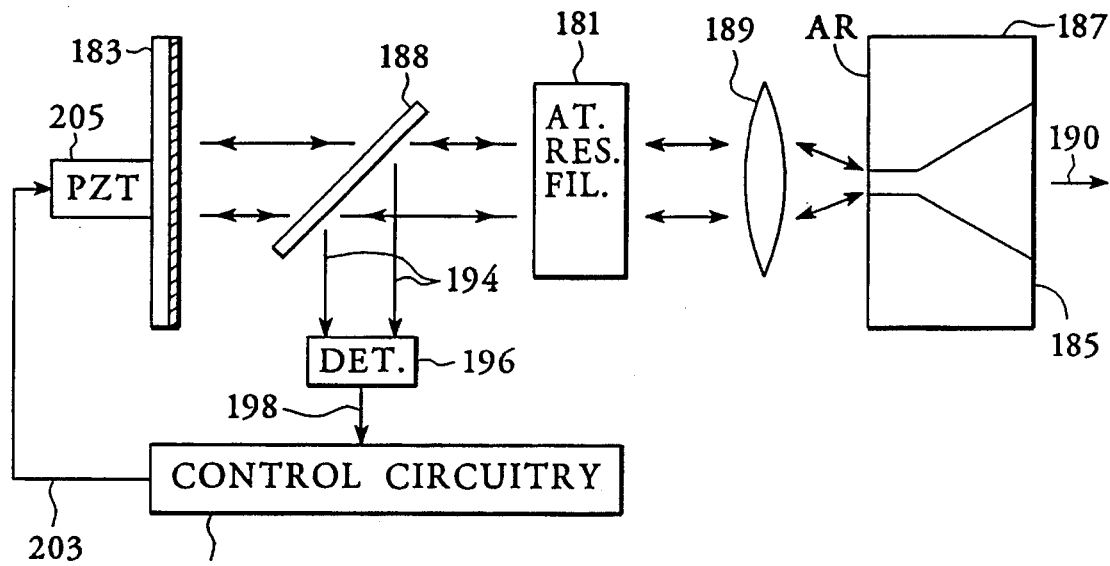
FIGS. 18–23 are top plan views of further wavelength-stabilized, external cavity lasers with various wavelength selecting elements in the laser cavity.

In FIG. 18, an atomic resonance filter 181 is incorporated into the external cavity. The arrangement is similar to that shown in FIG. 17, but with the atomic resonance filter 181 replacing the saturable absorber 172. The cavity is defined by an external rear reflector 183, such as a mirror or grating, and a low reflectivity front end facet 185 of an amplifier chip 187. The amplifier chip 187 may be any of those shown in FIGS. 3–12. A lens 189 between the amplifier chip 187 and the atomic resonance filter 181 collimates light received from the amplifier chip 187 and focuses return light reflected from the rear reflector 183 so as to couple the light back into the amplifier chip 187. The resulting laser produces a stable, single frequency output 190 having a frequency that is referenced to an atomic resonance frequency specified by the filter 181.

Some laser applications may need an especially stable output wavelength and thus require active stabilization of the laser cavity. This may be accomplished by means of a feedback loop providing active phase control of the laser cavity. The feedback signal is derived from a light signal passing through any narrow band wavelength-selective filter element located either inside or outside of the cavity, such as the atomic resonance filter 181 in FIG. 18 or the Fabry-Perot etalon 211 in FIG. 21. A beamsplitter 188 with low reflectivity is located in the light path within the laser cavity between filter element 181 and the external cavity reflector 183 on the narrow aperture side of amplifier chip 187. The bulk of the light is transmitted through the beamsplitter 188, while a small portion 194, typically only about 2% of the light in the cavity, is directed to detector 196. The electrical output 198 of the detector 196 represents the intensity of the light sample 194. If the wavelength of the light deviates from the peak transmission wavelength of the filter element 181, the sampled intensity 194 will decrease, indicating a need to actively adjust the oscillation wavelength of the laser cavity. The feedback signal 198 goes to electronic control circuitry 201 constructed according to known methods in the control system art. The circuitry 201 generates a phase control signal 203 applied to an active phase control element for the laser cavity. For example, the phase control element may be a piezoelectric transducer 205 mounted on the external mirror 183 of the cavity to adjust the cavity length. Alternatively, an electrically conductive contact, like the contact 283 in FIG. 28, may supply an independent current injection or an independent reverse bias voltage to a section of the single mode waveguide section 285 or another gain section of the amplifier chip 282, causing it to act as a phase controller. Other phase control elements include any of the electro-optic phase modulators, such as Pockels or Kerr cells, or the liquid crystal phase modulators, known in the art. All of these elements actively adjust the optical length of the cavity, and thus finely tune the laser's oscillation wavelength to maintain the output 192 with very fine precision at the wavelength where peak transmission through the filter element 181 occurs.

Figure 19:
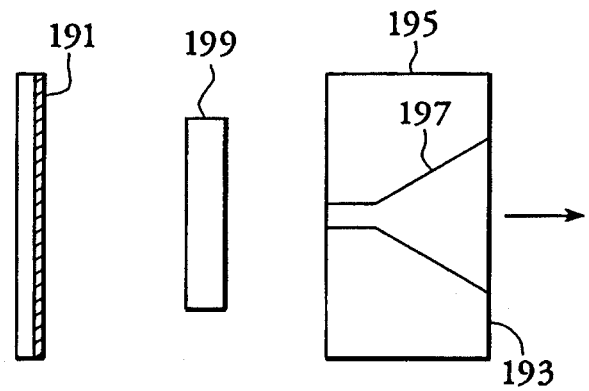

In FIG. 19, the external resonant cavity, defined by an external rear reflector 191, such as a mirror or grating, and a low reflectivity front end facet 193 of an amplifier chip 195 with flared gain region 197, includes a birefringence filter 199 for wavelength selection. The birefringence filter 199 stabilizes the wavelength of oscillation at a fixed frequency with very narrow bandwidth. Such a birefringence filter 199 could also be tunable. For example, as described by A. Schremer, et al. in *Applied Physics Letters* 55(1), pages 19–21 (1989), an electro-optic birefringent modulator can be placed in external cavities for wavelength tuning. Frequency modulation of the laser output could also be performed using such a configuration. The amplifier chip 195 with flared gain region 197 of the present invention ensures high power, single spatial mode outputs as the frequency is tuned or modulated.

Figure 20:
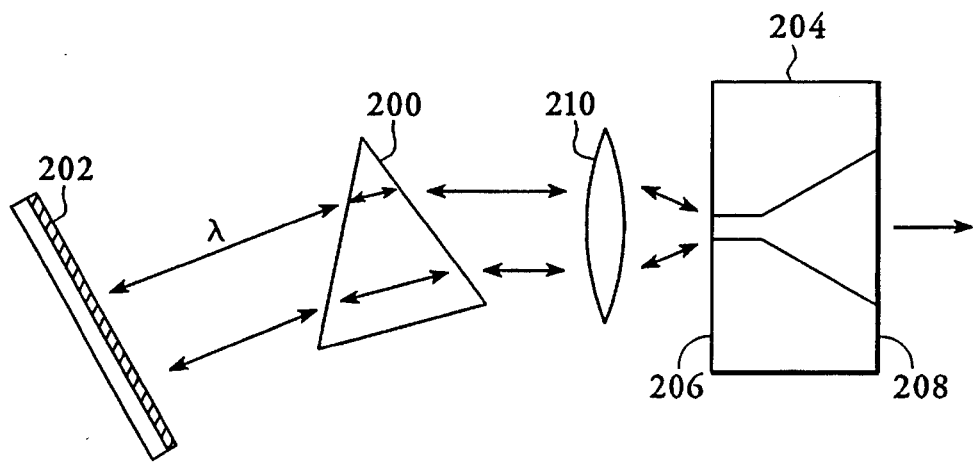

In FIG. 20, a prism 200 or other wavelength dispersive element and a fixed mirror 202 could be used to provide wavelength selective feedback in the external cavity and to obtain a wavelength stabilized output. An amplifier chip 204 can be any of those shown in Figs. 3–12. A rear end facet 206 is antireflection coated to prevent self-oscillation, while a front end facet 208 has low reflectivity. Together, the external mirror 202 and front end facet 208 define a resonant optical cavity for laser oscillation. A lens 210 receives and collimates light emitted from the amplifier chip 204 at the rear facet 206. A prism 200 is positioned between the lens 210 and mirror 202 and oriented for refracting the collimated beam received from lens 210. Preferably, prism 200 is made of a material, such as dense flint glass, that has high dispersion $|d\lambda/d\Theta|$ in the wavelength band coinciding with the gain band of the amplifier chip 204. The fixed orientation of the mirror 202 determines which wavelength of light will be incident perpendicular thereon and therefore which wavelength will be fed back into of the chip 204.

Figure 21:
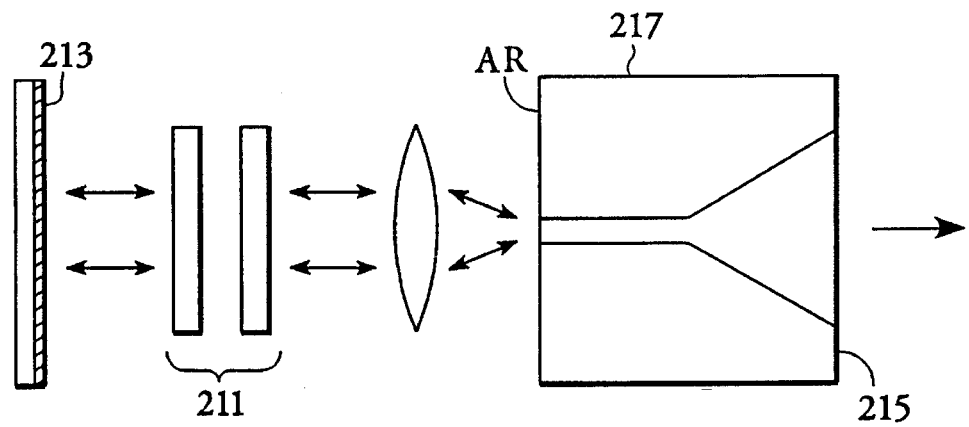

With reference to FIG. 21, yet another wavelength selective optical element that may be placed in the external laser cavity is an etalon 211 formed as usual by a pair of parallel, planar, partially reflective plates. The spacing between the two plates of the etalon establishes the set of wavelengths that constructively interfere and thus are capable of oscillating in the laser cavity with low loss. Again, the cavity is formed by a rear reflector 213, which can be any of the amplifying chips shown in FIGS. 3–12. The etalon can be used alone or in combination with other wavelength selective cavity elements like those seen in FIGS. 18–20 or any of the grating reflectors seen in FIGS. 1, 2A–2B, 13–15, 16A–16B, 17, 22 or 23.

Figure 22:
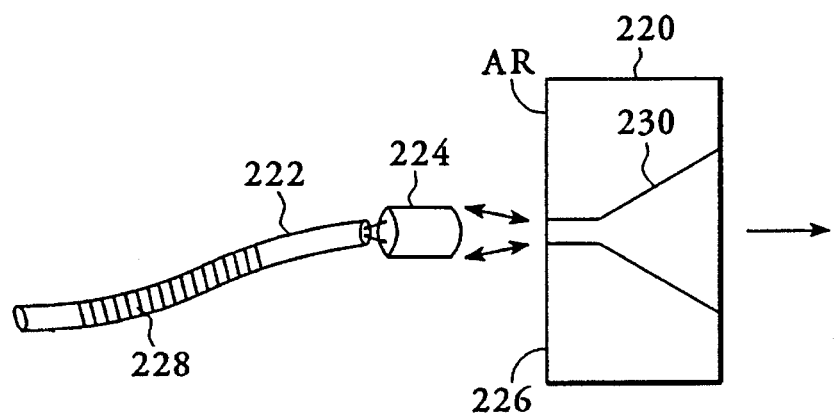

As seen in FIG. 22, the amplifier chip 220 may be optically coupled to an external optical fiber 222 which acts as a spatial mode filter for the amplifier chip 220. The optical fiber 222 is preferably a single mode fiber. The fiber 222 is coupled via a lens 224 to receive the light emitted from amplifier chip 220 through the AR coated facet 226. Lens 224 may be a graded-index (GRIN) rod lens, as shown. Frequency selective feedback is provided by a Bragg grating reflector 228 integrated into the optical fiber 222. The end of the fiber 222 beyond the grating reflector 228 can be cleaved or polished at an angle to minimize feedback from end reflections. In combination with our amplifier chip 220 with flared gain region 230, the fiber coupled laser achieves stable, high power single frequency operation with a narrow line-width. The grating could also be tuned, if desired, by applying stress or strain to the fiber in the grating region.

Figure 23:
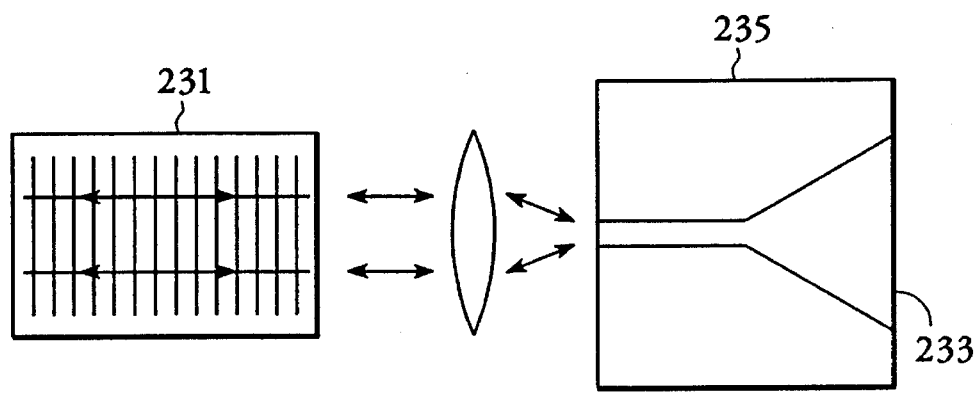

With reference to FIG. 23, an alternative to the fiber 222 with integral grating reflector 228 of FIG. 22 is a volume hologram 231 fabricated to act as a Bragg reflector element. For example, such holographic optical elements and their fabrication methods are described in U.S. Pat. No. 5,335,098 to Leyua et al. and are available commercially from Accuwave Corp. of Santa Monica, Calif. The hologram 231 takes the place of the rear grating reflector 15 in FIG. 1, for example, to form, with the front facet 233 of the amplifier chip 235, a resonant laser cavity.

Figure 24:
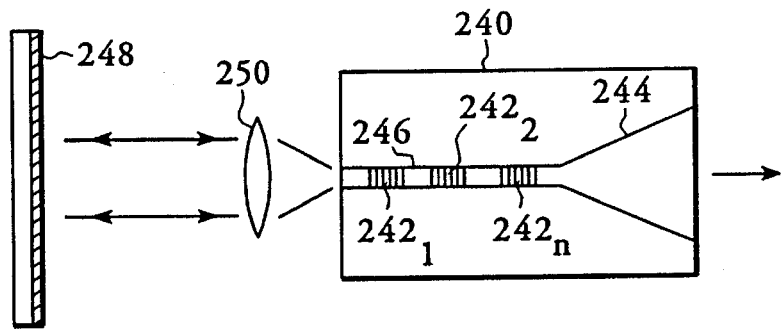
FIGS. 24–27 are top plan views of still other wavelength-stabilized laser devices with wavelength switchable or simultaneous multiple wavelength outputs.

With reference to FIG. 24, the amplifier chip 240 itself could have a series of short DBR grating segments $242_1$, $242_2, \ldots, 242_N$ of various grating pitches $\Lambda_1, \Lambda_2, \ldots, \Lambda_N$ between the flared amplifier section 244 and the single mode waveguide section 246 on the chip 240. A resonant optical cavity is defined between an external rear reflector 248, such as a mirror and a selected DBR grating segment $242_1$, $242_2$, $\ldots, 242_N$ Thus, the external mirror 248, a collimating and focusing lens 250, the single mode waveguide section 246 and the DBR grating segments $242_1, 242_2, \ldots, 242_N$ form a laser oscillator, which is coupled to a flared optical power amplifier 244 to form a multiple wavelength MOPA device. The MOPA device in FIG. 24 simultaneously emits a broad range of wavelengths corresponding to the stepwise-continuous reflection bands $\lambda_1 \pm \Delta\lambda_1, \lambda_2 \pm \Delta\lambda_2, \ldots, \lambda_N \pm \Delta\lambda_N$ of the DBR grating segments $242_1, 242_2, \ldots, 242_N$ and limited only by the gain band of the diode heterostructure 240. Wavelengths produced by sum and difference frequency mixing and nonlinear processes are also generated.

Figure 25:
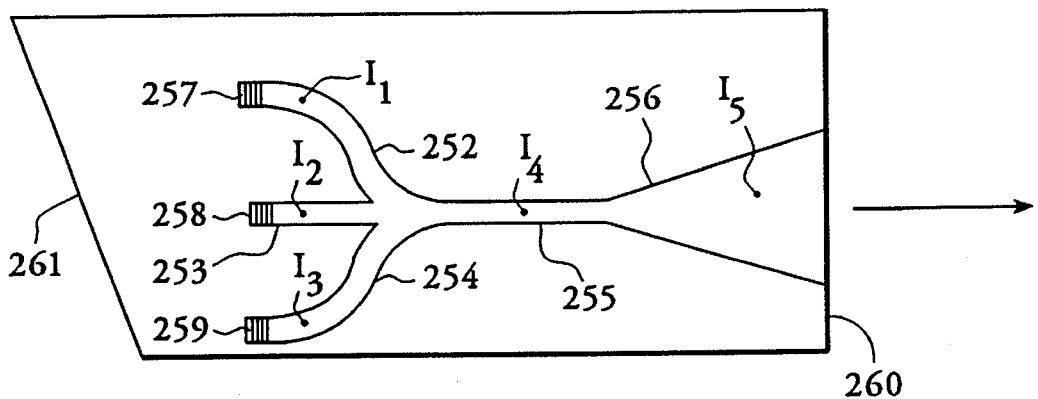

Referring to FIG. 25, another flared laser oscillator 251 has multiple single mode waveguide sections 252–254 feeding through a single mode combining section 255 to a common flared gain region 256. However, grating reflectors 257–259 having grating pitches $\Lambda_1, \Lambda_2$ and $\Lambda_3$ and placed in the light path, here at the rear ends of the single mode waveguide sections 252–254, are used to select the wavelengths of the laser output. The resonant cavity is defined by the gratings 257–259 and the low reflectivity front end facet 260. The rear facet 261 may be oriented at a nonperpendicular angle to the direction of light propagation in order to suppress possible Fabry-Perot modes of oscillation. Different currents $I_1$–$I_5$ may be applied to respective sections 252–256. Selected excitation of the various sections with currents of $I_1$, $I_2$ or $I_3$ results in discrete switching of output wavelengths.

Figure 26:
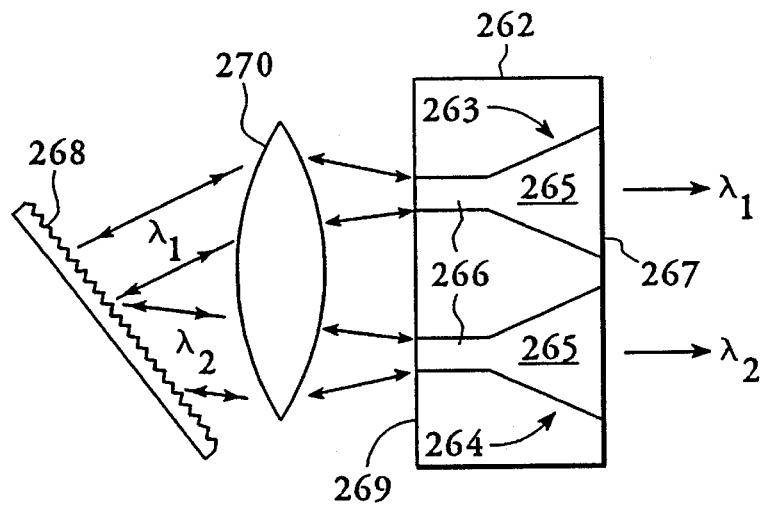

With reference to FIG. 26, an amplifier chip 262 may have a monolithic array of sources 263, 264, etc. for simultaneous operation in multiple wavelengths $\lambda_1, \lambda_2$ etc. Each source 263, 264, etc. on the amplifier chip 262 is constructed, as in FIGS. 3–12, with a flared gain section 265 and a spatial mode filter, such as a single mode waveguide section 266, at the narrow end of the flared gain section 265. The front output facet 267 at the broad end of each flared gain section 265 is characterized by low reflectivity and forms, together with a fixed orientation, external rear grating reflector 268, a resonant cavity for laser operation. The rear end facet 269 is antireflection (AR) coated to prevent self-oscillation of the amplifier chip 262. The flared gain regions 265 of each source 263, 264, etc. in the array can be fabricated to amplify at different emission wavelengths. This is done, for example, by using a single quantum well strained layer InGaAs/InAlGaAs laser, where the gain band may be 50 nm wide. In order to make the single monolithic amplifier chip 262 capable of operating over a large wavelength range (e.g. 630 nm to 1100 nm) with each array element 263, 264, etc. operating over about a 50 nm bandwidth, the multiwavelength amplifier array can be fabricated as described for laser arrays in U.S. Pat. Nos. 4,925,811, 4,955,030 and 5,039,627 to Menigaux et al. These laser array structures have stacks of alternate confinement layers and active layers, with each active layer being of a different composition from the others and being characterized by a different gain wavelength. PN junctions are formed in the vicinity of different active layers in the stack by means of localized introduction and diffusion of a p-type impurity to different depths. An alternative way to form a multiwavelength amplifier array is to use multiple amplifier chips, each having a different amplifying wavelength. In either case, light beams emitted through the apertures 266 of the multiple sources 263, 264, etc. at the AR coated rear facet 269 are collimated by a lens 270 and reflected from the external grating reflector 268 back through the lens 270 to be focussed on the rear facet 269. The relative positions of the apertures 266 with respect to the lens 270 determine the amount of bending of the light paths for the various emitted beams, and therefore determine the different incidence angles of each beam on the grating 268. Only light of particular wavelengths $\lambda_1$, $\lambda_2$, etc. corresponding to the respective incidence angles are coupled back through the apertures 266 into the amplifier chip 262. Thus, each source 263, 264, etc. located in the external cavity will only oscillate at a particular wavelength $\lambda_1$, $\lambda_2$, etc. corresponding to the incidence angle of light from that source onto the grating 268. The gain band of the active medium for each source 263, 264, etc. should be selected to match its resonance band in the cavity. A Fabry-Perot external mirror in combination with a wavelength dispersion element, such as a prism, could be used in place of grating reflector 268, as in the configuration of FIG. 20.

Figure 27:
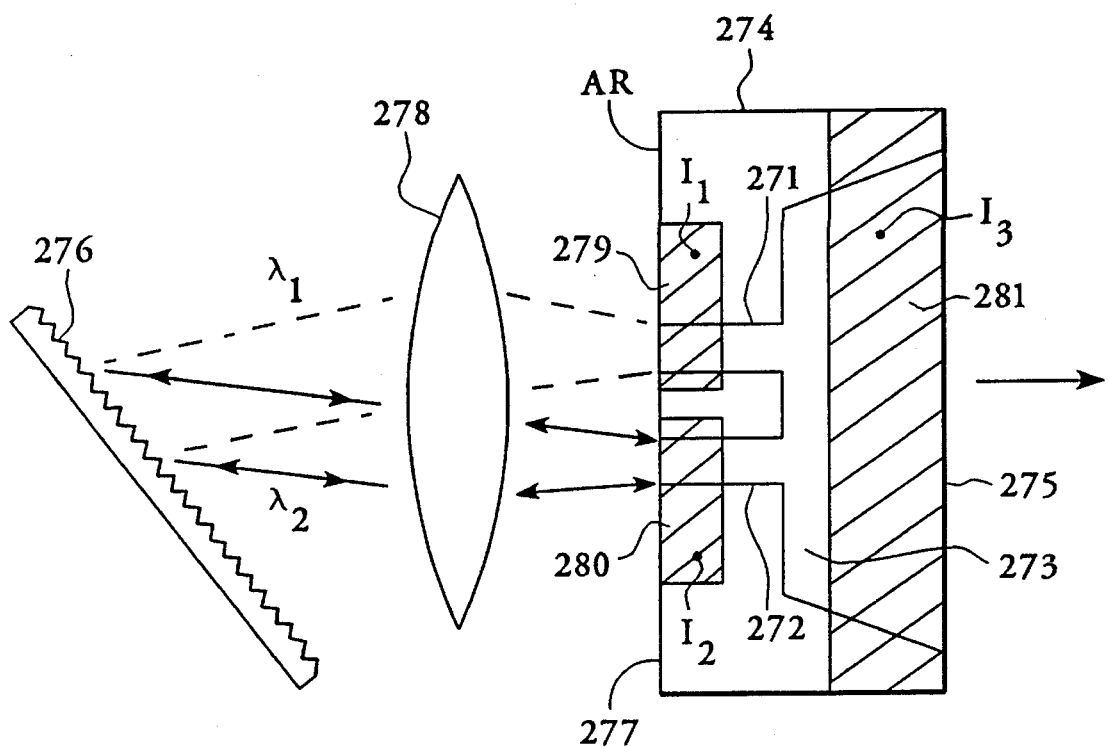

With reference to FIG. 27, several single mode waveguide regions 271 and 272 may be coupled to a single flared gain region 273 on an amplifier chip 274 for providing a wavelength switching or simultaneous multiwavelength lasing capability. As in FIG. 26, the amplifier chip 274 has a front light emitting facet 275 that is of low reflectivity and that forms, along with external rear grating reflector 276, a resonant cavity for laser oscillation. Rear facet 277 of the amplifier chip 274 is antireflection coated. A lens 278 is positioned between the rear facet 277 and the grating reflector 276.

As in FIG. 26, the difference in position of the light emitting waveguide apertures 271 and 272 at rear facet 277 relative to the lens 278 results in a difference in incidence angle of the light beams upon the grating 276 and thus a difference in the wavelength $\lambda_1$ or $\lambda_2$ that can oscillate. The waveguides 271 and 272 should be spaced sufficiently far apart to minimize crosstalk, but sufficiently close that both wavelengths $\lambda_1$ and $\lambda_2$ fall within the gain spectrum of the common flared gain region 273. Separate electrical contacts 279 and 280 independently bias the waveguides 271 and 272 and independently inject current $I_1$ and $I_2$ into the respective waveguides. At least one other conductive contact 281 provides current $I_3$ to the flared gain region 273. Biasing only one of the waveguides 271 and 272 so as to minimize loss in the selected waveguide will select the wavelength $\lambda_1$ or $\lambda_2$ of the output beam. Alternatively, operating both waveguides 271 and 272 would lead to simultaneous multiple wavelength operation, as well as the generation of harmonics of the wavelengths $\lambda_1$ and $\lambda_2$.

Figure 28:
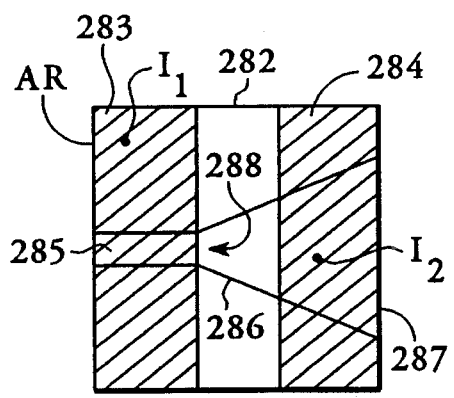
FIGS. 28 and 29 are top plan views of two alternative amplifier chips for use in any of the preceding external laser cavities of the present invention with differential pumping.

In FIG. 28, an amplifier chip 282 has separate conductive contacts 283 and 284 for the single mode waveguide 285 and flared gain section 286. Each section 285 and 286 can thus be pumped independently with separate electrical currents $I_1$ and $I_2$. One use of such a configuration is for intensity modulation of the laser. As a result of the individual contacts 283 and 284, the output power emitted through low reflectivity output facet 287 can be modulated by simply modulating the pump current $I_1$ supplied to the single mode waveguide section 285, instead of trying to modulate a single larger pump current provided to the entire amplifier chip. Higher speed modulation and lower modulation current requirements are thus achieved with this amplifier chip configuration. The independently pumped single mode waveguide section 285 might also be used as a preamplifier to bring the optical power coupled into it from the feedback grating 15 of FIG. 1 up to saturation levels before the light enters the flared gain section 286. More than two separate contacts might also be present on the amplifier chip. For example, the flared gain section 286 could be differentially pumped with a lower current density provided by one conductive contact to the input end 288 of the flared gain section 286 and a higher current density provided by another conductive contact closer to the output end of the gain section 286 near facet 287. Such differential pumping will reduce noise in the optical output signal. Differential pumping with a lower current density in input region 288 versus other portions of the flared gain section 286 will also increase the diffraction-limited output power significantly over that obtained from a uniformly pumped flared region 286.

Figure 29:
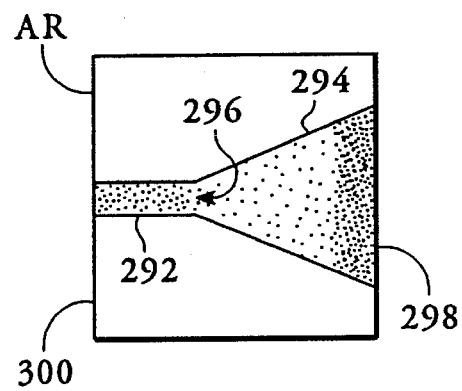

Referring to FIG. 29, differential pumping of an amplifier chip 290 may also be achieved by means of a selective proton implantation in the gain regions 292 and 294 during fabrication of the chip 290. The varying densities of implanted proton sites in the surface of the amplifier chip 290 cause varying resistivities to electric current over the length of the gain regions 292 and 294. As a result, a uniform bias voltage applied to the gain regions 292 and 294 will produce a current density distribution that varies in different areas of those gain regions 292 and 294, producing differential pumping. In the particular embodiment shown in FIG. 29, the density of stipling in the drawing represents the surface conductivity in a particular area of the illustrated amplifier chip 290. Thus it can be seen that the rear portion of the flared gain section 294 nearest the narrow aperture 296 connecting the flared gain section 294 to the waveguide section 292 has a lower surface conductivity, and thus is pumped with a lower current density, than the broad front portion of the flared gain region 294 nearest the low reflectivity front output facet 298 of the amplifier chip 290. The single-mode waveguide section 292 could have a conductivity which is like the front portion of the flared gain region 294 or intermediate or equal or higher in value between the high and low conductivity front and rear portions of the flared gain section 294. Regions near facets 298 and 300 may be left unpumped to ensure long life at high power, such as in a window laser formed by quantum size effects, impurity induced disordering, doping, composition change or other means.

With reference to FIGS. 30A and 30B, a light amplifying diode heterostructure 301 with a pn rectifying junction 302 for providing an active region for amplification of lightwaves has a single mode waveguide section 303 for guiding propagation of the lightwaves and a two-part flared gain section 304a and 304b in which the lightwaves are allowed to freely diffract as they are amplified. In this embodiment, proton surface implants 305 electrically isolate the respective waveguide section 303 and flared gain section parts 304a and 304b so that each isolated part can be separately pumped with a different amount of electric current $I_1$, $I_2$ and $I_3$. Other electrical isolation techniques, such as selective surface etching, could be used in place of proton surface implants 305 to provide the isolation. Separate conductive surface contacts for each region apply the different current levels $I_1$, $I_2$ and $I_3$ to the respective regions. Current $I_1$ applied to single mode waveguide 303 may be adjusted to optimally excite the narrow aperture end of flared gain region 304a and/or can be modulated to modulate the laser output. Current $I_2$ applied to the narrower rear part 304a of the flared gain region may be lower than the current $I_3$ applied to the broader part 304b in order to minimize amplification of signal noise and to suppress the formation of filaments. Current $I_2$ could also be modulated to modulate the laser output. The laser's resonant cavity is again defined by an external rear grating reflector 306 for frequency stability and by a low reflectivity front output facet 307 of the amplifier chip 301. Alternatively, the grating reflector 306 may be replaced by a plane mirror in combination with any of the above-described wavelength selective optical elements placed within the cavity as in FIGS. 18–21. Mode locking of the output can be achieved by modulation of at least a portion of the single mode waveguide 303 (or other regions) with a current at a frequency of c/2nL, where c/n is the speed of light in the cavity and L is the cavity length. Also, note that passive mode locking could also be used. A reverse bias section of waveguide 303 could provide a saturable absorbing region, for example, or an external saturable absorber element can be used as in FIG. 17. A lens or lens system 309 collimates light emitted from the single mode waveguide 303 through antireflection coated rear facet 308 for reflection by the grating 306 and focuses the light reflected by the grating 306 back onto rear facet 308 for coupling into waveguide 303.

Figure 31:
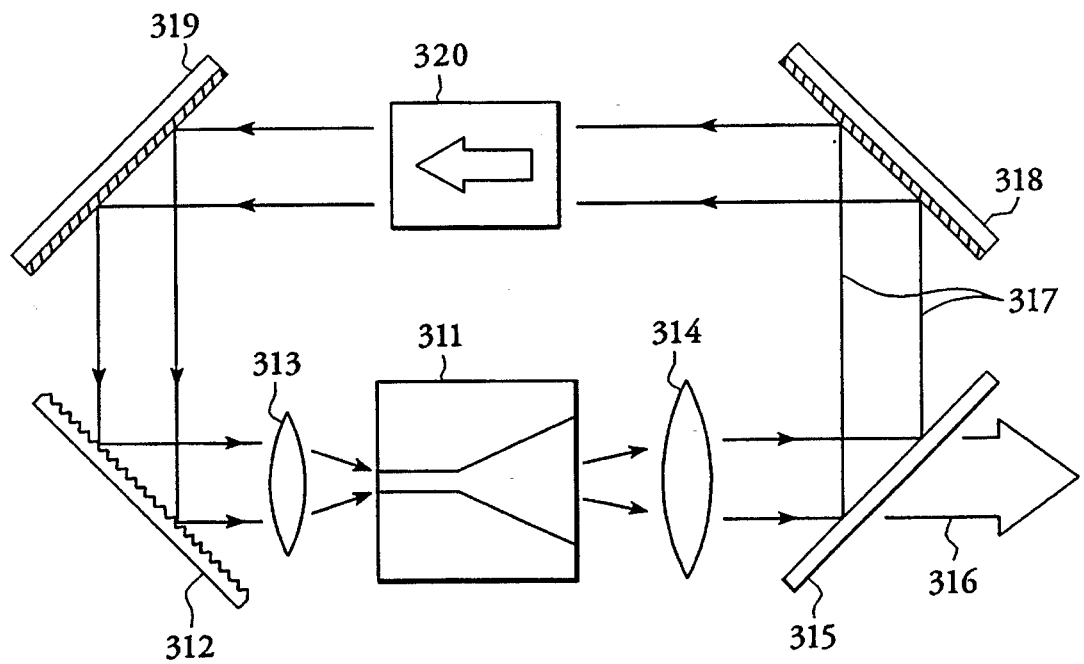
FIGS. 31 and 32 are schematic top plan views of two wavelength-stabilized, ring cavity semiconductor lasers of the present invention.

In addition to the standing-wave cavity configurations shown in the preceding figures, ring laser cavities can also be used to obtain stable, narrow band, wavelength selected, laser emission at high output powers. Ring cavity configurations are known to provide narrower-band radiation with reduced feedback sensitivity relative to corresponding standing-wave cavity configurations. With reference to FIG. 31, a ring laser using a flared amplifier chip 311 like those shown in FIGS. 3–12 operates in a single pass with high gain. The ring cavity reflectors include a grating 312 coupling a single narrow wavelength band of light through the focusing optics 313 into the narrow aperture end of the amplifier chip 311. If the narrow aperture end is a single mode waveguide, then only about 5 to 10 mW of incident light need be coupled into that waveguide in order to saturate the flared gain region so as to provide greater than 1 W cw of output power. The output light from the amplifier chip 311 is collimated by one or more lenses 314 and directed through a low reflectivity beamsplitter 315 to form the output beam 316. Only a small fraction of the light incident on the beamsplitter 315 is diverted and folded back via reflectors 318 and 319 to the grating reflector 312 and back into the amplifier chip 311. An optical isolator 320 can be inserted into the ring cavity to enforce unidirectional oscillation.

Figure 32:
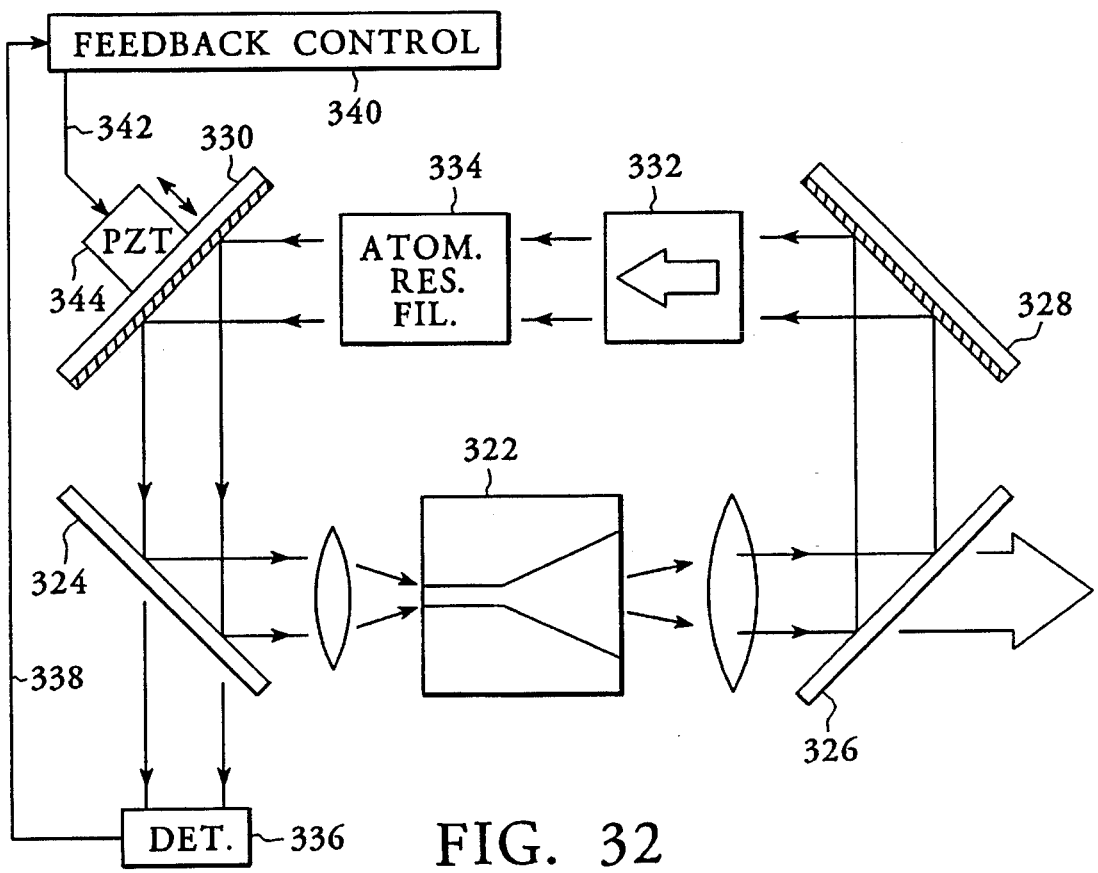

With reference to FIG. 32, other frequency stabilized ring lasers can be constructed by inserting a combination of atomic resonance filters, birefringent filters, prisms or etalons in place of or in addition to the diffraction grating 312 of FIG. 31. For example, in FIG. 32, an amplifier chip 322 like those in FIGS. 3–12 is located in a ring cavity defined by mirror and beam-splitter elements 324–327 and focusing and collimating optics 329 and 330, with an optical isolator 332 forcing unidirectional light propagation within the ring cavity. A narrow band, wavelength selective element 334, in this case an atomic resonance filter is located in the light path within the cavity. Any dispersive elements, such as prisms or gratings, in the cavity can be fixed at a particular orientation to provide a stable oscillation wavelength or can be rotated to achieve wavelength tuning. Active stabilization is accomplished by sampling a small portion of the light in the cavity after it has passed through the filtering element 334, but before it has been reamplified in the amplifying chip 322, for example by transmission through a mostly reflective beam-splitter 324 to a detector 336. The detector 336 generates an electrical feedback signal 338 representative of the circulating light intensity in the cavity. A feedback control circuit 338 responsive to this electrical feedback signal 338 generates an error signal 342 with which to actively provide fine adjustment of the optical path length. This fine adjustment may be accomplished using independent current or voltage contacts on the amplifier chip 322 to vary the phase of light propagating therein, adjusting the phase with electro-optic phase modulators, such as Pockels and Kerr cells, or liquid crystal phase modulators, or as shown here, by inducing a variable delay lag in the optical path via PZT control 344 of the position of one of the cavity mirrors 327.

The ring laser configurations are characterized by reduced sensitivity to optical feedback compared to standing-wave cavities, since any light fed back into the cavity travels in a counter propagating direction to the ring mode, and therefore, to first order, does not alter its phase. The ring cavities also have enhanced frequency (wavelength) and power stability and a narrow linewidth.

Each of the above-described lasers and MOPA devices is characterized by a light amplifying diode heterostructure or amplifier chip with a flared gain region that allows light propagating therein to freely diffract. In the lasers of the present invention, the diverging light which is partially reflected by the low reflectivity front end facet continues to diverge, so that only the central rays pass through the narrow aperture end of the flared gain region and through the antireflection coated rear facet of the amplifier chip to the external rear reflector of the resonant cavity. Effectively, the cavity acts as a marginally stable resonator with a single mode spatial filter that ensures a single spatial mode of oscillation. The light output from the broad front end of the flared gain region is characterized by high powers (in excess of 1 W cw) and good modal quality. Frequency selective elements in the external cavity provide stable, single frequency and narrow linewidth outputs even at high output power levels.

We claim:

1. A wavelength-stabilized semiconductor laser, comprising a semiconductor light amplifying chip including a gain region that permits light propagation with a diverging phase front therein, excitation means for pumping said light amplifying chip, optical feedback means defining a resonant laser cavity with said light amplifying chip being located at least partially therein, said resonant laser cavity having a single-spatial-mode filter therein, said optical feedback means including a first reflector that is positioned such that light propagating with said diverging phase front is incident thereon, light reflected back toward said single-spatial-mode filter by said first reflector also having a diverging phase front, said optical feedback means also including an external rear reflector, and wavelength selective means within said resonant laser cavity for providing a relatively lower optical loss in said cavity to a selected wavelength of said light propagating within said cavity than to other nonselected wavelengths, such that stable laser oscillation is established at said selected wavelength.

2. The laser of claim 1 wherein said single-spatial-mode filter in said resonant laser cavity is integral with said light amplifying chip.

3. The laser of claim 1 wherein said wavelength selective means comprises a grating.

4. The laser of claim 1 wherein said external rear reflector is a grating with a fixed orientation relative to said light amplifying chip, said grating also forming said wavelength selective means.

5. The laser of claim 1 wherein said external rear reflector is a mirror.

6. The laser of claim 5 wherein said wavelength selective means comprises a dispersive element optically located between said light amplifying chip and said mirror.

7. The laser of claim 6 wherein said dispersive element is a grating with a fixed orientation relative to said light amplifying chip.

8. The laser of claim 6 wherein said dispersive element is a grating with a fixed orientation relative to said mirror.

9. The laser of claim 6 wherein said dispersive element is a prism with a fixed orientation relative to said light amplifying chip.

10. The laser of claim 6 wherein said dispersive element is a prism with a fixed orientation relative to said mirror.

11. The laser of claim 1 wherein said wavelength selective means comprises an atomic resonance filter within said resonant laser cavity.

12. The laser of claim 1 wherein said wavelength selective means comprises a birefringent filter within said resonant laser cavity.

13. The laser of claim 1 wherein said wavelength selective means includes an etalon within said resonant laser cavity.

14. The laser of claim 1 further comprising means for mode locking the laser.

15. The laser of claim 14 wherein said mode locking means includes a saturable absorber located within said resonant laser cavity.

16. The laser of claim 15 wherein said excitation means pumps said light amplifying chip in periodic pulses synchronized with a saturation and relaxation period of said saturable absorber.

17. The laser of claim 1 wherein said external rear reflector is a grating integrally formed within an optical fiber, said fiber being optically coupled to said light amplifying chip.

18. The laser of claim 1 wherein said external rear reflector is a volume hologram.

19. The laser of claim 1 wherein said gain region permitting light propagation with said diverging phase front is a flared region.

20. The laser of claim 19 wherein said single-spatial-mode filter is defined by a narrow end of said flared region.

21. The laser of claim 19 wherein said single-spatial-mode filter is defined by a single mode waveguide in said light amplifying chip coupled to a narrow end of said flared region.

22. The laser of claim 21 wherein said single mode waveguide and said narrow end of said flared region are of substantially the same width.

23. The laser of claim 21 wherein said single mode waveguide tapers to a narrow output, said narrow end of said flared region being of substantially the same width as said narrow output of said single mode waveguide.

24. The laser of claim 21 wherein said narrow end of said flared region is wider than said single mode waveguide.

25. The laser of claim 21 wherein said single mode waveguide tapers to a narrow output, said narrow end of said flared region being wider than said narrow output of said single mode waveguide.

26. The laser of claim 1 wherein said light amplifying chip has an end surface within said resonant laser cavity which is oriented at a Brewster angle relative to a direction of light propagation in said cavity.

27. The laser of claim 1 wherein said light amplifying chip has a rear end facet which is oriented at an angle providing total internal reflection of light propagating in said chip, whereby light is reflected vertically by said angled rear end facet through a substantially nonreflective top or bottom emitting surface of said chip toward said external reflector of said resonant laser cavity.

28. The laser of claim 1 wherein said first reflector is a front end surface of said light amplifying chip.

29. The laser of claim 1 wherein said first reflector is a grating formed within said light amplifying chip in said gain region permitting said diverging phase front.

30. The laser of claim 1 wherein said light amplifying chip includes a grating output coupler for providing light emission through a top or bottom surface of said chip.

31. The laser of claim 1 wherein an external grating is disposed in the path emitted from a front end of said light amplifying chip.

32. The laser of claim 1 wherein said gain region is located entirely within said resonant laser cavity.

33. The laser of claim 1 wherein a first portion of said gain region is located within said resonant laser cavity so as to form a laser oscillator section, and a second portion of said gain region is located outside of said resonant laser cavity so as to form an optical power amplifier section optically coupled to said laser oscillator section.

34. The laser of claim 33 wherein said first reflector of said resonant laser cavity is a grating integrally formed within said light amplifying chip between said first and second portions of said gain region.

35. The laser of claim 1 wherein said light amplifying chip has an array of gain regions laterally spaced apart therein, each permitting propagation of light with a diverging phase front therein.

36. The laser of claim 35 wherein each of said laterally spaced apart gain regions in said array has a different gain wavelength band.

37. The laser of claim 36 wherein said external rear reflector is a grating reflector with a fixed orientation relative to said light amplifying chip, and wherein a lens is disposed between said grating reflector and a plurality of single-spatial-mode light apertures of said array of gain regions, said lens being positioned to bend the path of light from each aperture toward said grating reflector at an incidence angle corresponding to an oscillation wavelength that coincides with the gain wavelength band of the corresponding gain region of said array.

38. The laser of claim 1 wherein a plurality of single mode waveguides are optically coupled to said gain region permitting said diverging gain front, and wherein said wavelength selective means provides relatively lower losses to a different selected wavelength for each of said plurality of waveguides.

39. The laser of claim 38 wherein said excitation means includes a separate electrically conductive contact associated with each waveguide for selectively biasing at least one of said waveguides.

40. The laser of claim 1 wherein said light amplifying chip is a diode heterostructure, and said excitation means comprises means for injecting electric current into said heterostructure.

41. The laser of claim 40 wherein said electric current injecting means provides different pump current densities to said gain region at least along a longitudinal dimension of said light amplifying chip.

42. The laser of claim 40 wherein said electric current injecting means comprises a first electrically conductive contact disposed over a single mode waveguide section of said light amplifying chip, and at least one other separate electrically conductive contact disposed over a flared gain region of said light amplifying chip, each contact injecting an amount of electric current which is independent of the amount of electric current injected by each other contact.

43. The laser of claim 42 wherein the amount of electric current injected by said first contact into said single mode waveguide section is modulated.

44. The laser of claim 42 wherein plural contacts are disposed over said flared gain region, said plural contacts applying different current densities to different portions of said flared gain region.

45. The laser of claim 44 wherein a lower current density is applied by one said contact to a narrow input end of said flared gain region than the current density applied to a wider output end of said flared gain region.

46. The laser of claim 1 wherein said semiconductor light amplifying chip has peak gain in a near-infrared wavelength region suitable for material analysis.

47. The laser of claim 46 wherein said near-infrared wavelength region is in a range from 700–1000 nm.

48. The laser of claim 46 wherein said stable laser oscillation established at said wavelength selected by said wavelength selective means is within said near-infrared wavelength region, said selected wavelength lying between a lower fluorescence limit and an upper detection limit for Raman spectroscopy, such that said selected wavelength is sufficiently long to minimize fluorescence from a material to be analyzed and sufficiently short to maximize sensitivity of a detector used to collect Raman-scattered radiation from the material to be analyzed.

49. The laser of claim 48 wherein an optical fiber is optically coupled to light amplifying chip to receive output radiation at said selected wavelength therefrom and optically coupled to said material to be analyzed to deliver said output radiation thereto.

50. The laser of claim 1 further comprising means for actively controlling an optical length of the laser cavity.

51. The laser of claim 50 wherein said active control means includes means for finely adjusting a position of an external reflector of said laser cavity.

52. The laser of claim 51 wherein said position adjusting means comprises a piezoelectric transducer mounted to said external reflector.

53. The laser of claim 50 wherein said active control means includes an optical phase control element within said laser cavity.

54. The laser of claim 53 wherein said phase control element comprises an electrical contact on said semiconductor light amplifying chip injecting current into a portion of said chip.

55. The laser of claim 53 wherein said phase control element comprises an electrical contact on said semiconductor light amplifying chip applying a reverse bias voltage to a portion of said chip.

56. The laser of claim 53 wherein said phase control element comprises an electro-optic phase modulator in said laser cavity.

57. The laser of claim 53 wherein said phase control element comprises a liquid-crystal phase modulator in said laser cavity.

58. The laser of claim 50 wherein said active control means includes a narrow band wavelength selective filter element positioned in the light path, and detection means for monitoring the intensity of light emitted from said laser cavity.

59. The laser of claim 58 wherein said filter element is located in said laser cavity.

60. The laser of claim 58 wherein said filter element is outside of said laser cavity in the path of light emitted from said laser cavity.

61. The laser of claim 58 wherein said filter element is an atomic resonance filter.

62. The laser of claim 58 wherein said filter element is an etalon.

63. The laser of claim 58 wherein a beamsplitter in the path of light emitted from said laser cavity directs a sample of said emitted light to said detector means.

64. A wavelength-stabilized semiconductor ring laser, comprising a semiconductor light amplifying chip including a gain region that permits light propagation from a first end to a second end with a diverging phase front therein, excitation means for pumping said light amplifying chip, optical recirculation means for defining a resonant ring cavity with a single-spatial-mode filter and said light amplifying chip located at least partially within said resonant ring cavity, said optical recirculation means including optical splitter means for dividing light output from said second end of said light amplifying chip into a higher power first portion forming an output beam from said cavity and a lower power second portion and optical coupling means for coupling said second portion of said divided light output into said first end of said light amplifying chip via an optical path separate from said gain region of said light amplifying chip, said optical recirculation means further including optical isolator means for establishing and maintaining unidirectional light propagation in said ring cavity corresponding to said light propagation in said gain region from said first and to said second end of said light amplifying chip, and wavelength selective means within said resonant ring cavity for providing a relatively lower loss in said cavity to a selected wavelength of said light propagating within said cavity than to other nonselected wavelengths, such that stable laser oscillation is established at said selected wavelength.

65. The laser of claim 64 wherein said single-spatial-mode filter is integral with said light amplifying chip.

66. The laser of claim 64 wherein said wavelength selective means comprises a dispersive element located with said ring cavity.

67. The laser of claim 66 wherein said dispersive element comprises a reflective diffraction grating.

68. The laser of claim 66 wherein said dispersive element comprises a transmissive diffraction grating.

69. The laser of claim 66 wherein said dispersive element comprises a prism.

70. The laser of claim 66 wherein said dispersive element comprises a volume hologram.

71. The laser of claim 64 wherein said wavelength selective means comprises an atomic resonance filter within said ring cavity.

72. The laser of claim 64 wherein said wavelength selective means comprises a birefringent filter within said ring cavity.

73. The laser of claim 64 wherein said wavelength selective means comprises an etalon within said ring cavity.

74. The laser of claim 64 wherein said gain region permitting divergent light propagation in said light amplifying chip comprises a flared region.

75. The laser of claim 74 wherein said single-spatial-mode filter is defined by a narrow end of said flared region.

76. The laser of claim 74 wherein said single-spatial-mode filter is defined by a single mode waveguide in said light amplifying chip coupled to a narrow end of said flared region.

77. The laser of claim 76 wherein said single mode waveguide and said narrow end of said flared region are of substantially the same width.

78. The laser of claim 76 wherein said single mode waveguide tapers to a narrow output, said narrow end of said flared region being of substantially the same width as said narrow output of said single mode waveguide.

79. The laser of claim 76 wherein said narrow end of said flared region is wider than said single mode waveguide.

80. The laser of claim 76 wherein said single mode waveguide tapers to a narrow output, said narrow end of said flared region being wider than said narrow output of said single mode waveguide.

81. The laser of claim 64 wherein said light amplifying chip includes a grating output coupler for providing light emission through a top or bottom surface of said chip.

82. The laser of claim 64 wherein said light amplifying chip is a diode heterostructure, and said excitation means comprises means for injecting electric current into said heterostructure.

83. The laser of claim 82 wherein said electric current injecting means provides different pump current densities to said gain region at least along a longitudinal dimension of said light amplifying chip.

84. The laser of claim 82 wherein said electric current injecting means comprises a first electrically conductive contact disposed over a single mode waveguide section of said light amplifying chip, and at least one other separate electrically conductive contact disposed over a flared gain region of said light amplifying chip, each contact injecting an amount of electric current which is independent of the amount of electric current injected by each other contact.

85. The laser of claim 84 wherein the amount of electric current injected by said first contact into said single mode waveguide section is modulated.

86. The laser of claim 84 wherein plural contacts are disposed over said flared gain region, said plural contacts applying different current densities to different portions of said flared gain region.

87. The laser of claim 86 wherein a lower current density is applied by one said contact to a narrow input end of said flared gain region than the current density applied to a wider output end of said flared gain region.

88. The laser of claim 64 wherein said semiconductor light amplifying chip has peak gain in a near-infrared wavelength region suitable for material analysis.

89. The laser of claim 88 wherein said near-infrared wavelength region is in a range from 700–1000 nm.

90. The laser of claim 88 wherein said stable laser oscillation established at said wavelength selected by said wavelength selective means is within said near-infrared wavelength region, said selected wavelength lying between a lower fluorescence limit and an upper detection limit for Raman spectroscopy, such that said selected wavelength is sufficiently long to minimize fluorescence from a material to be analyzed and sufficiently short to maximize sensitivity of a detector used to collect Raman-scattered radiation from the material to be analyzed.

91. The laser of claim 90 wherein an optical fiber is optically coupled to receive said output beam from said ring cavity at said selected wavelength and optically coupled to said material to be analyzed to deliver said output radiation thereto.

92. The laser of claim 64 further comprising means for actively controlling an optical length of the ring cavity.

93. The laser of claim 92 wherein said active control means includes means for finely adjusting a position of an external reflector forming part of said optical coupling means of said ring cavity.

94. The laser of claim 93 wherein said position adjusting means comprises a piezoelectric transducer mounted to said external reflector.

95. The laser of claim 92 wherein said active control means includes an optical phase control element within said ring cavity.

96. The laser of claim 95 wherein said phase control element comprises an electrical contact on said semiconductor light amplifying chip injecting current into a portion of said chip.

97. The laser of claim 95 wherein said phase control element comprises an electrical contact on said semiconductor light amplifying chip applying a reverse bias voltage to a portion of said chip.

98. The laser of claim 95 wherein said phase control element comprises an electro-optic phase modulator in said ring cavity.

99. The laser of claim 95 wherein said phase control element comprises a liquid-crystal phase modulator in said ring cavity.

100. The laser of claim 92 wherein said active control means includes a narrow band wavelength selective filter element positioned in the light path.

101. The laser of claim 100 wherein said filter element is located in said ring cavity.

102. The laser of claim 100 wherein said filter element is outside of said ring cavity in the path of said output beam.

103. The laser of claim 100 wherein said filter element is an atomic resonance filter.

104. The laser of claim 100 wherein said filter element is an etalon.

105. The laser of claim 64 wherein a single-mode optical fiber forms part of said coupling means within said ring cavity.

\* \* \* \* \*